United States Patent
Yasuda et al.

(10) Patent No.: US 9,634,021 B2
(45) Date of Patent: Apr. 25, 2017

(54) METHOD OF MANUFACTURING SEMICONDUCTOR DEVICE

(71) Applicant: FUJITSU SEMICONDUCTOR LIMITED, Yokohama-shi, Kanagawa (JP)

(72) Inventors: Makoto Yasuda, Kuwana (JP); Taiji Ema, Inabe (JP); Mitsuaki Hori, Kuwana (JP); Kazushi Fujita, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 17 days.

(21) Appl. No.: 14/734,262

(22) Filed: Jun. 9, 2015

(65) Prior Publication Data
US 2015/0364484 A1 Dec. 17, 2015

(30) Foreign Application Priority Data

Jun. 12, 2014 (JP) .................................. 2014-121678

(51) Int. Cl.
| | |
|---|---|
| H01L 21/00 | (2006.01) |
| H01L 27/11546 | (2017.01) |
| H01L 29/66 | (2006.01) |
| H01L 21/66 | (2006.01) |
| H01L 21/28 | (2006.01) |
| H01L 29/423 | (2006.01) |

(Continued)

(52) U.S. Cl.
CPC .. *H01L 27/11546* (2013.01); *H01L 21/28273* (2013.01); *H01L 21/84* (2013.01); *H01L 22/20* (2013.01); *H01L 27/1203* (2013.01); *H01L 29/105* (2013.01); *H01L 29/42324* (2013.01); *H01L 29/66575* (2013.01); *H01L 29/66825* (2013.01); *H01L 21/26506* (2013.01); *H01L 21/26513* (2013.01); *H01L 22/12* (2013.01)

(58) Field of Classification Search
CPC ............................ H01L 27/11546; H01L 21/84
USPC ............................................................ 438/7
See application file for complete search history.

(56) References Cited

U.S. PATENT DOCUMENTS

| | | | |
|---|---|---|---|
| 6,100,565 A | 8/2000 | Ueda | |
| 8,053,322 B2 * | 11/2011 | Drobny | ............. H01L 21/28123 257/E21.301 |

(Continued)

FOREIGN PATENT DOCUMENTS

| | | |
|---|---|---|
| JP | 11-74531 A | 3/1999 |
| JP | 2012-79746 A | 4/2012 |

*Primary Examiner* — Jami M Valentine
(74) *Attorney, Agent, or Firm* — Westerman, Hattori, Daniels & Adrian, LLP

(57) ABSTRACT

A semiconductor device manufacturing method includes forming a silicon layer by epitaxial growth over a semiconductor substrate having a first area and a second area; forming a first gate oxide film by oxidizing the silicon layer; removing the first gate oxide film from the second area, while maintaining the first gate oxide film in the first area; thereafter, increasing a thickness of the first gate oxide film in the first area and simultaneously forming a second gate oxide film by oxidizing the silicon layer in the second area; and forming a first gate electrode and a second gate electrode over the first gate oxide film and the second gate oxide film, respectively, wherein after the formation of the first and second gate electrodes, the silicon layer in the first area is thicker than the silicon layer in the second area.

12 Claims, 22 Drawing Sheets

(51) Int. Cl.
  *H01L 21/84* (2006.01)
  *H01L 27/12* (2006.01)
  *H01L 29/10* (2006.01)
  H01L 21/265 (2006.01)

(56) References Cited

U.S. PATENT DOCUMENTS

| | | | | |
|---|---|---|---|---|
| 2003/0040185 A1* | 2/2003 | Jun | ............ | H01L 21/76208 |
| | | | | 438/695 |
| 2010/0163997 A1* | 7/2010 | Drobny | ............ | H01L 21/28123 |
| | | | | 257/368 |
| 2011/0037103 A1* | 2/2011 | Yamaguchi | ....... | H01L 21/82380 |
| | | | | 257/255 |
| 2012/0080759 A1 | 4/2012 | Ema et al. | | |
| 2012/0293203 A1* | 11/2012 | Ohmaru | ............ | H03K 19/1776 |
| | | | | 326/44 |
| 2014/0377921 A1* | 12/2014 | Ema | ............ | H01L 27/11543 |
| | | | | 438/258 |

* cited by examiner

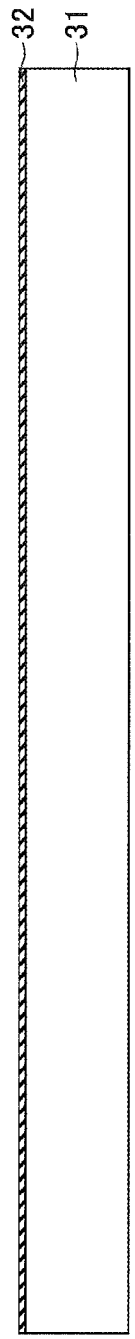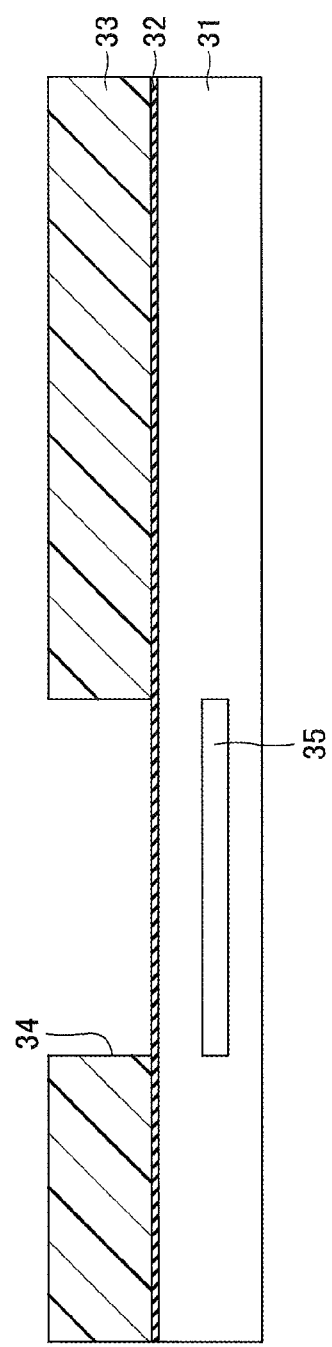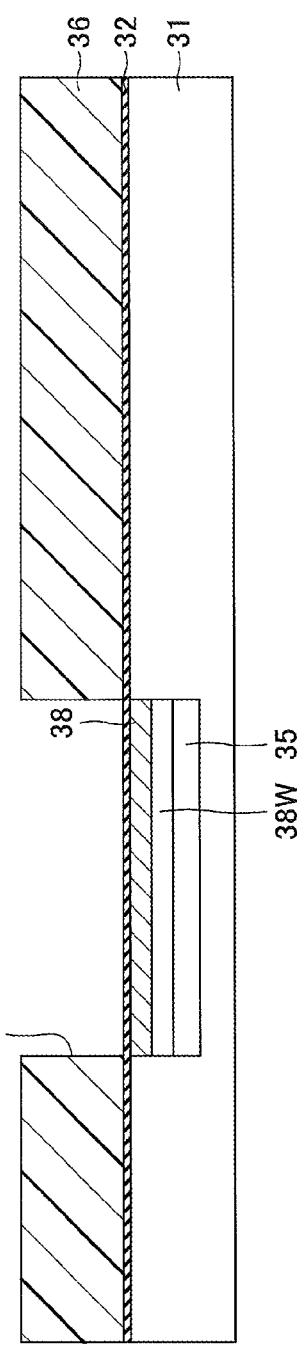

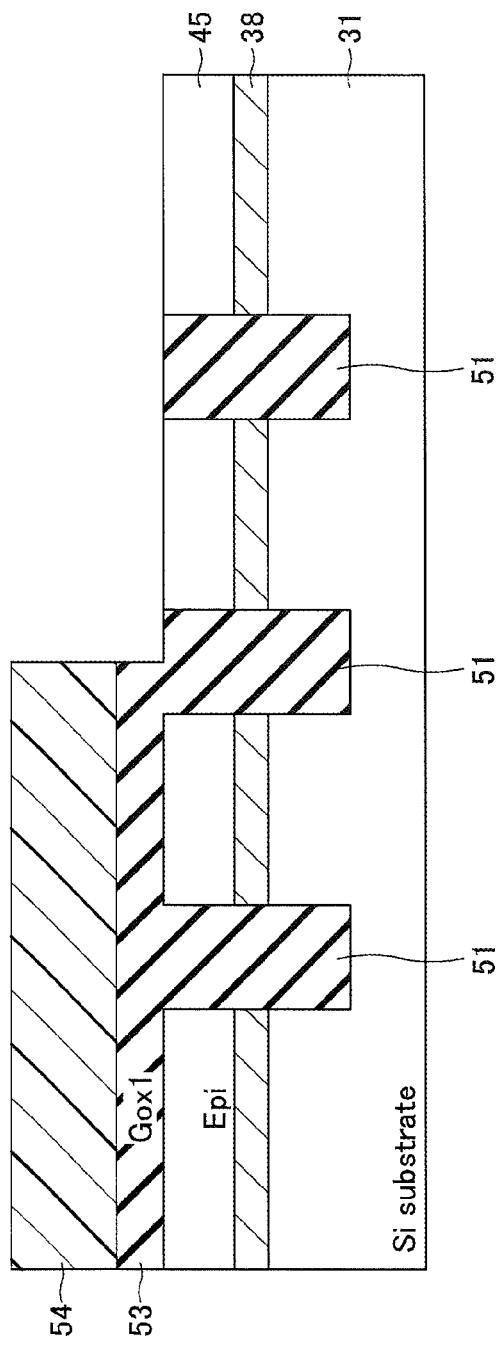
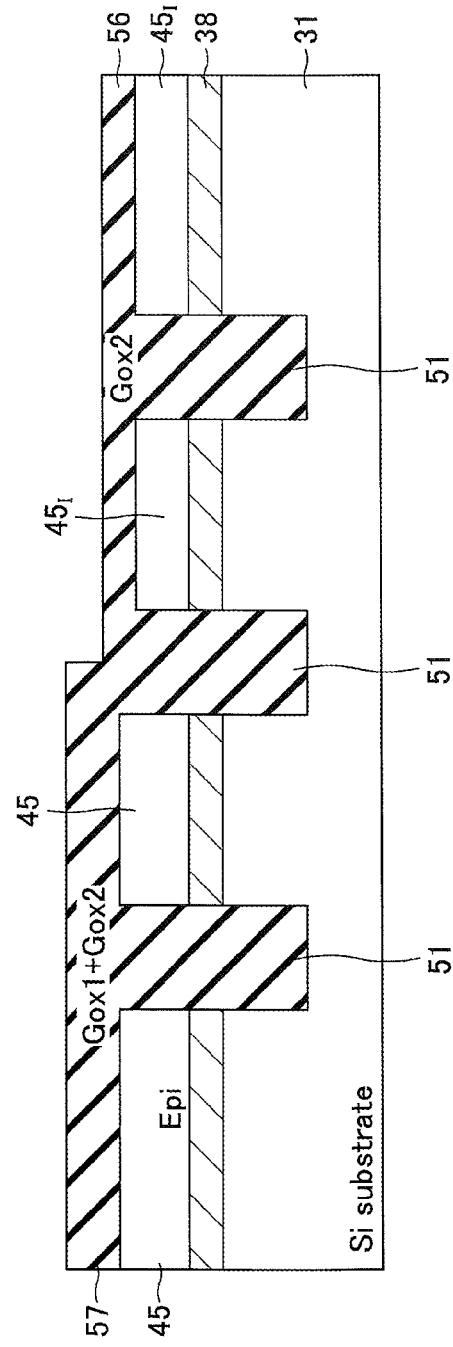
FIG.6A
FIG.6B

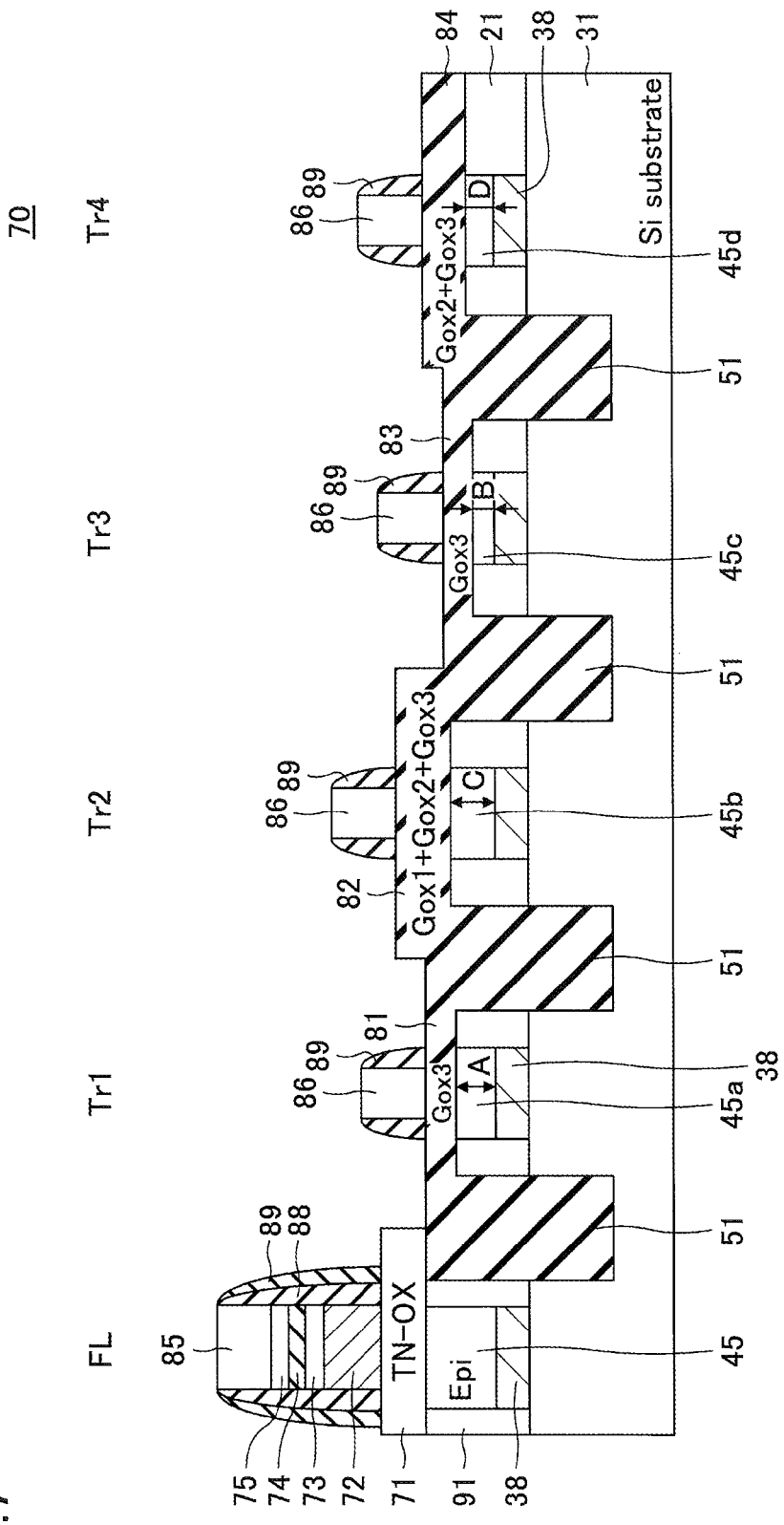

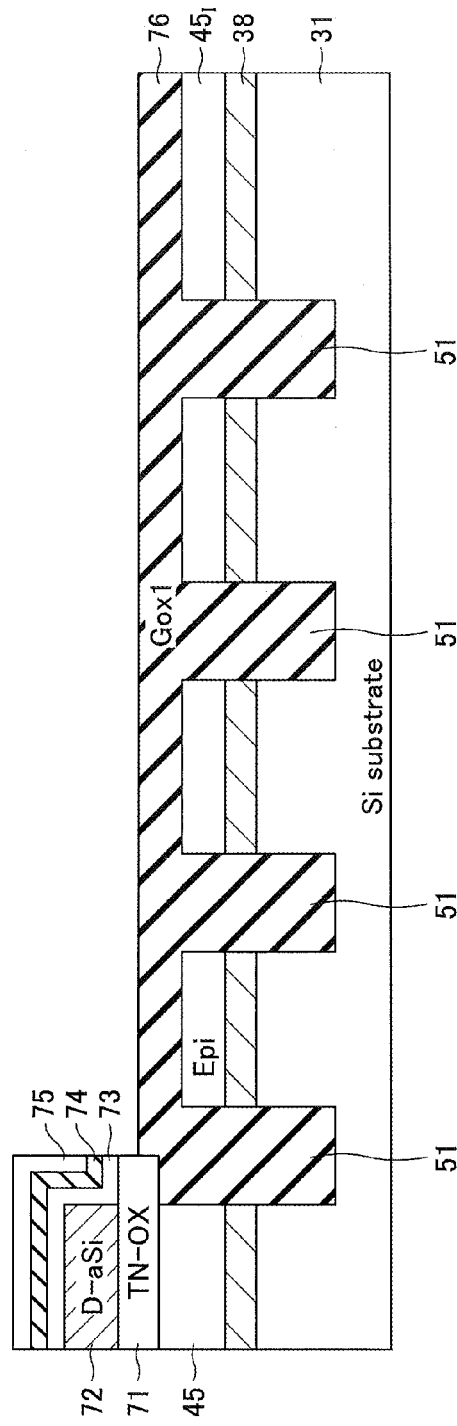
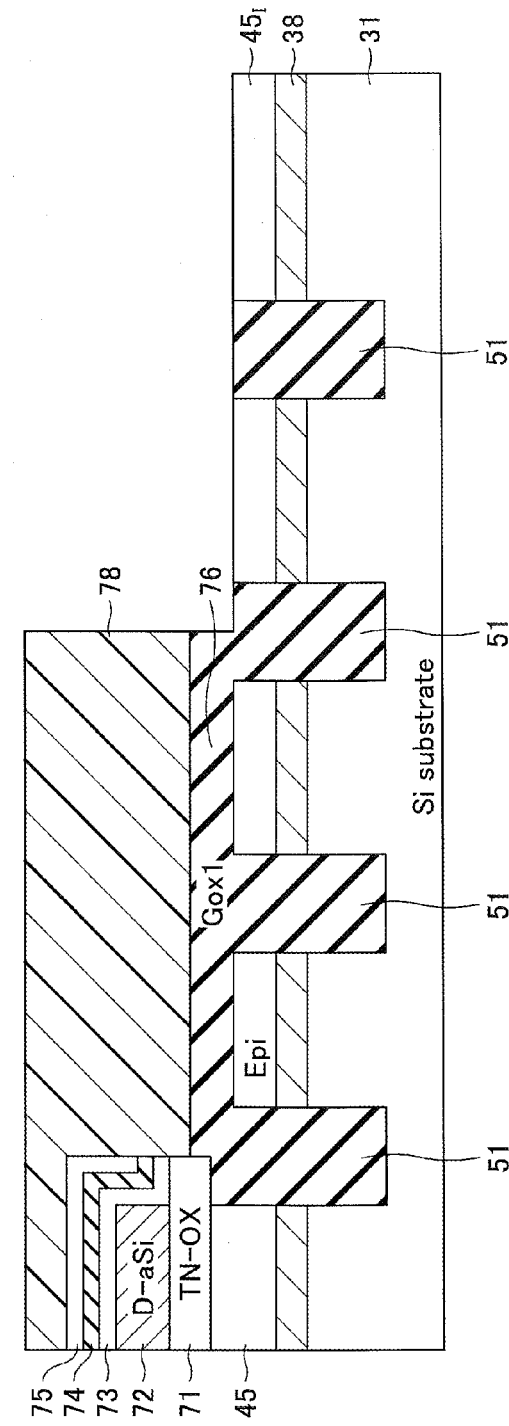

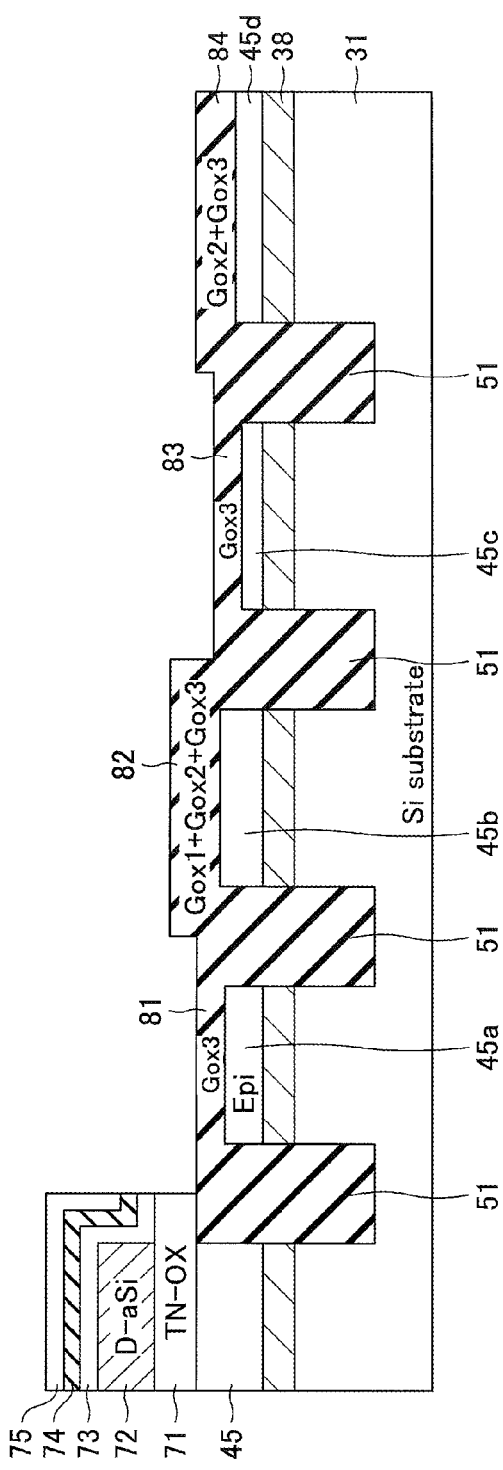
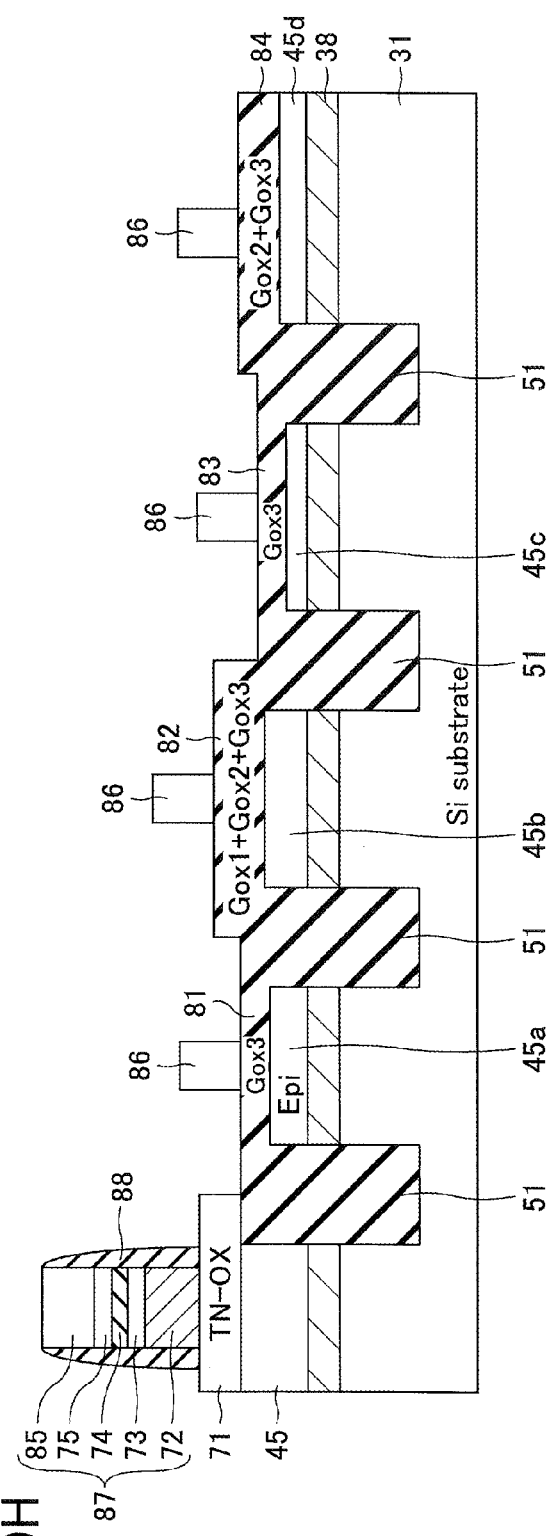

POSITION IN FURNACE DURING EPITAXIAL GROWTH

METHOD OF MANUFACTURING SEMICONDUCTOR DEVICE

CROSS-REFERENCE TO RELATED APPLICATIONS

This application is based upon and claims the benefit of priority of the prior Japanese Patent Application No. 2014-121678 filed on Jun. 12, 2014, which is incorporated herein by references in its entirety.

FIELD

The disclosures herein relate to a method of manufacturing a semiconductor device.

BACKGROUND

In order to reduce variation in threshold voltage due to statistical fluctuation in channel impurity, a non-doped epitaxial silicon layer is formed over a highly doped channel layer that has a steep distribution of impurity density. It is proposed to control the threshold voltage of a transistor by adjusting the thickness of the non-doped epitaxial silicon layer. See, for example, Japanese Laid-open Patent Publication No. 2012-79746. An epitaxial silicon layer formed in an area assigned to high-threshold-voltage transistors is made thinner than an epitaxial silicon layer formed in an area assigned to low-threshold-voltage transistors. With this arrangement, different types of transistors with different performances can be arranged on the same substrate.

FIG. 1 illustrates a conventional process for forming epitaxial silicon layers with different thicknesses. An epitaxial silicon layer 112 is formed over a highly-doped layer 111 on a silicon substrate 131 (S101). Then, a photoresist mask 113 is formed by a photolithographic technique (S102) and a part of the epitaxial silicon layer 112 is etched to produce an epitaxial silicon layer 114 with a different thickness (S103). Then, a first gate oxide film (Gox1) 116 is formed over the entire surface including a trench 115 to form a device-isolating layer 117 (S104). A photoresist layer 123 with an opening pattern in an area not illustrated is formed and an unnecessary portion of the first gate oxide film 116 is removed by etching (S105). This step is referred to as "oxide film etching 1". Then, the photoresist layer 123 is removed and second gate oxidation is performed to form a second gate oxide (Gox2) film (S106). In an area having been covered with the photoresist layer 123 during the process of oxide film etching 1, a gate oxide layer (Gox1+Gox2) 119 is formed. In the area (not illustrated) to which the oxide film etching 1 was applied, a gate oxide film that is thinner than the gate oxide film 119 is formed. Unnecessary portions of the gate oxide film 119 are removed (S107). Then, a third gate oxide film (Gox3) 24 is formed by gate oxidation 3 (S108).

The conventional method partially changes the thickness of the epitaxial silicon layer using a photolithography technique and an etching technique. Accordingly, at least two additional steps, i.e., a photography step and an etching step are added. It is desirable to create non-doped epitaxial layers with different thicknesses in an ordinary process without adding extra steps.

SUMMARY

According to an aspect of the embodiments, a method of manufacturing a semiconductor device include steps of forming a silicon layer by epitaxial growth over a semiconductor substrate having a first area and a second area;

forming a first gate oxide film by oxidizing the silicon layer;

removing the first gate oxide film from the second area, while maintaining the first gate oxide film in the first area;

after the removal of the first gate oxide film from the second area, increasing a thickness of the first gate oxide film in the first area, and simultaneously forming a second gate oxide film by oxidizing the silicon layer in the second area; and forming a first gate electrode and a second gate electrode over the first gate oxide film and the second gate oxide film, respectively, wherein after the formation of the first gate electrode and the second gate electrode, the silicon layer in the first area has a first thickness, and the silicon layer in the second area has a second thickness less than the first thickness.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 4A illustrates a manufacturing process of the semiconductor device of the first embodiment;

FIG. 4B illustrates a manufacturing process of the semiconductor device of the first embodiment;

FIG. 4C illustrates a manufacturing process of the semiconductor device of the first embodiment;

FIG. 6A illustrates a manufacturing process of the semiconductor device of the first embodiment;

FIG. 6B illustrates a manufacturing process of the semiconductor device of the first embodiment;

FIG. 7 is a schematic diagram of a semiconductor device fabricated using a film-thickness control technique for epitaxial silicon layers according to the second embodiment;

FIG. 9C illustrates a manufacturing process of the semiconductor device of the second embodiment;

FIG. 9D illustrates a manufacturing process of the semiconductor device of the second embodiment;

FIG. 9G illustrates a manufacturing process of the semiconductor device of the second embodiment;

FIG. 9H illustrates a manufacturing process of the semiconductor device of the second embodiment;

DESCRIPTION OF EMBODIMENTS

A novel technique of forming non-doped epitaxial layers with different thicknesses is provided. Non-doped epitaxial layers with different thicknesses are fabricated in an ordinary semiconductor process without introducing additional photolithography and etching steps.

In addition, the inventors found that the thickness of an epitaxial silicon layer varies during epitaxial growth depending on a position in a furnace. The variations in thickness of epitaxial silicon layers cause variations in transistor characteristics (such as threshold voltage) between wafers in a lot and between lots. Accordingly, it is also desirable to reduce variations in the thickness of epitaxial silicon layers.

The embodiments make use of an oxide film forming process to control the thickness of epitaxial silicon layers to fabricate a semiconductor device with epitaxial silicon layers of different thicknesses. In addition, variation in the thickness of epitaxial silicon layers is reduced by controlling the thickness of initial oxide films.

Figure 2:
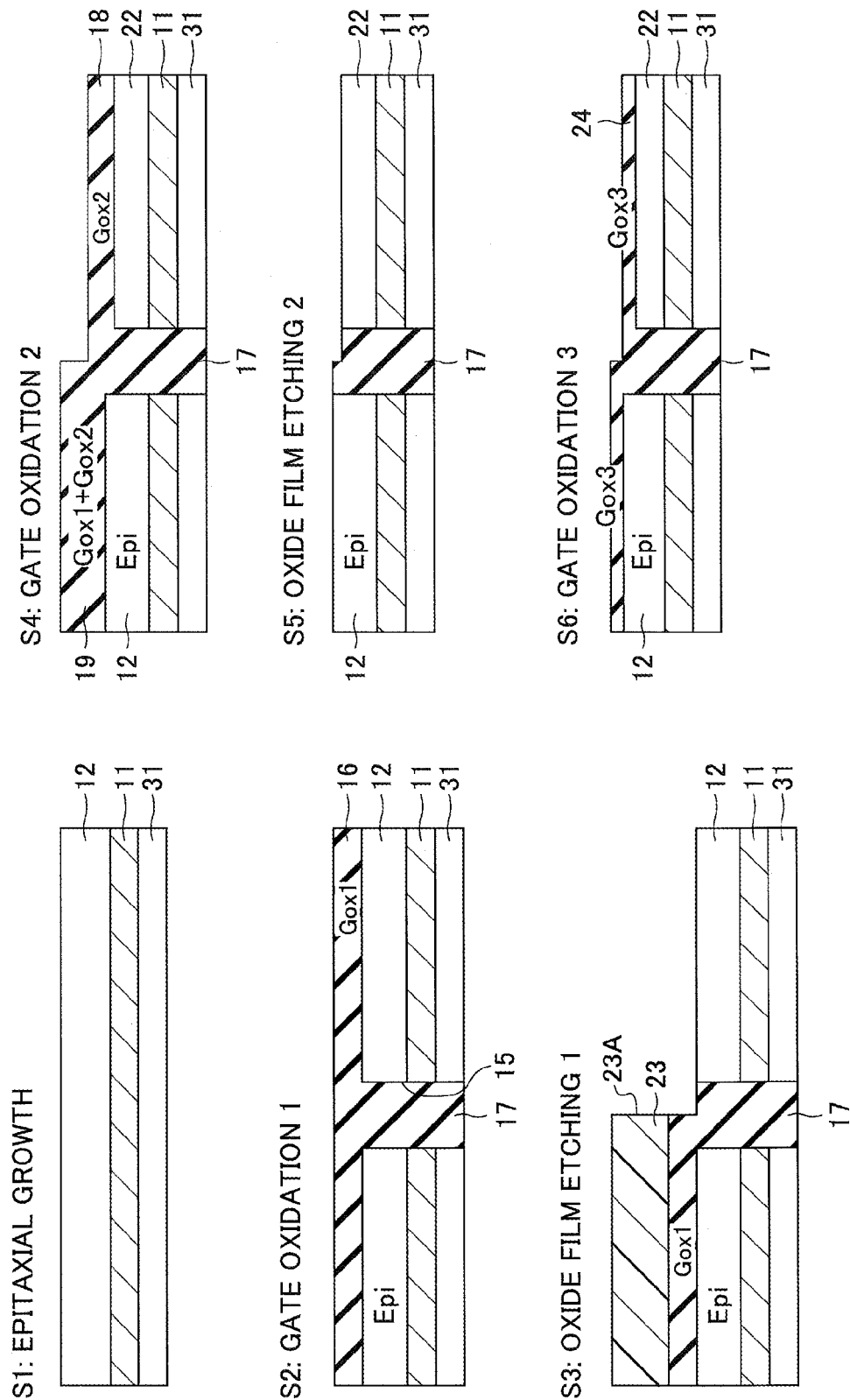
FIG. 2 illustrates a technique of controlling the thickness of an epitaxial silicon layer according to an embodiment.

FIG. 2 illustrates a basic idea of the embodiments to control the thickness of epitaxial silicon layers. A highly-doped layer 11 is formed in a predetermined area on a silicon substrate 31, and a non-doped silicon layer is formed over the silicon substrate 31 by epitaxial growth (S1). The non-doped silicon layer formed by epitaxial growth is referred to as a "epitaxial silicon layer".

Then, a gate oxide film (Gox1) 16 is formed over the entire surface including a trench 15, and a device-isolating layer 17 is formed (S2). Unlike the conventional method, additional photolithography and etching steps are not introduced to change the thickness of the epitaxial silicon layer 12 prior to the formation of the gate oxide film 16.

Figure 1:
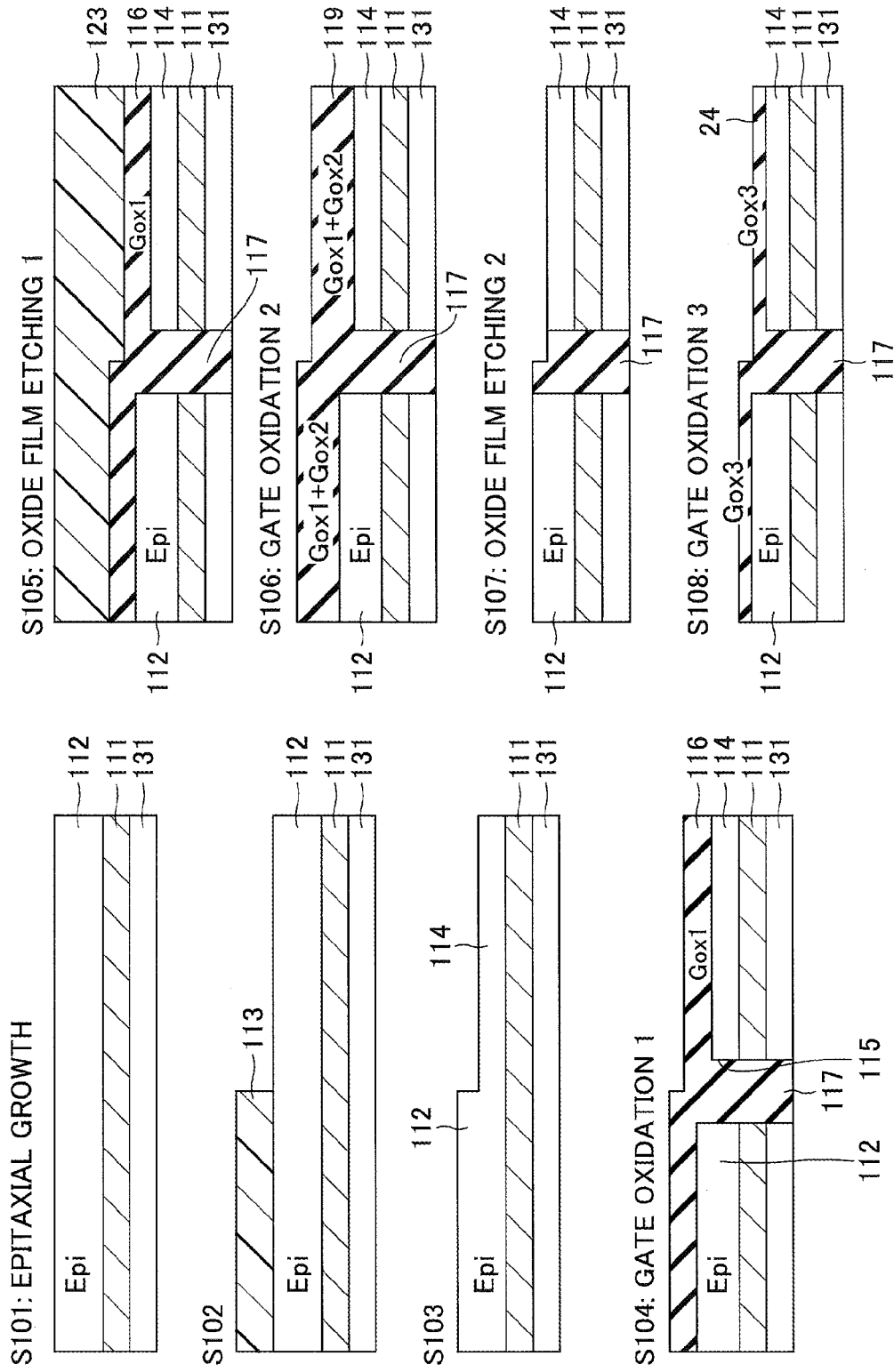
FIG. 1 illustrates a conventional technique for controlling the thickness of an epitaxial silicon layer.

Then, a photoresist layer 23 is formed and an opening 23A is formed during the ordinary photoresist patterning process. The opening 23A is arranged in an area that is not exposed by the conventional method (see FIG. 1). The gate oxide film 16 exposed in the opening 23A is etched (S3). The opening 23A is formed in a region in which the thickness of the epitaxial silicon layer 12 is to be altered.

Then, the photoresist layer 23 is removed and the second gate oxidation (gate oxidation 2) is performed to form a gate oxide film (Gox2+Gox1) 19 in the area having been covered with the photoresist layer 23. During the process of gate oxidation 2, a gate oxide film (Gox1) 18 is formed simultaneously with the gate oxide film 19, in the area having been exposed in the opening 23A (S4). During the formation of the gate oxide film (Gox1) 18, a surface region of the epitaxial silicon layer 12 is oxidized in the area of the opening 23A and the oxidized surface region becomes a part of the gate oxide film 18. Consequently. The thickness of the epitaxial silicon layer 12 is reduced. By making use of the process of gate oxidation 2 (S4), epitaxial silicon layers 12 and 22 with different thicknesses are formed without carrying out etching on the epitaxial silicon layer 12.

Then, unnecessary portions of the gate oxide film 18 and the gate oxide film 19 are removed by etching (S5). Then, a third gate oxide film (Gox3) 24 is formed in a desired area (S6).

In the embodiments described below, the thickness of the epitaxial silicon layer is controlled by making use of an oxidation process, and epitaxial silicon layers with different thicknesses can be formed in accordance with threshold voltages of transistors, without introducing additional photolithography and etching processes.

First Embodiment

Figure 3:
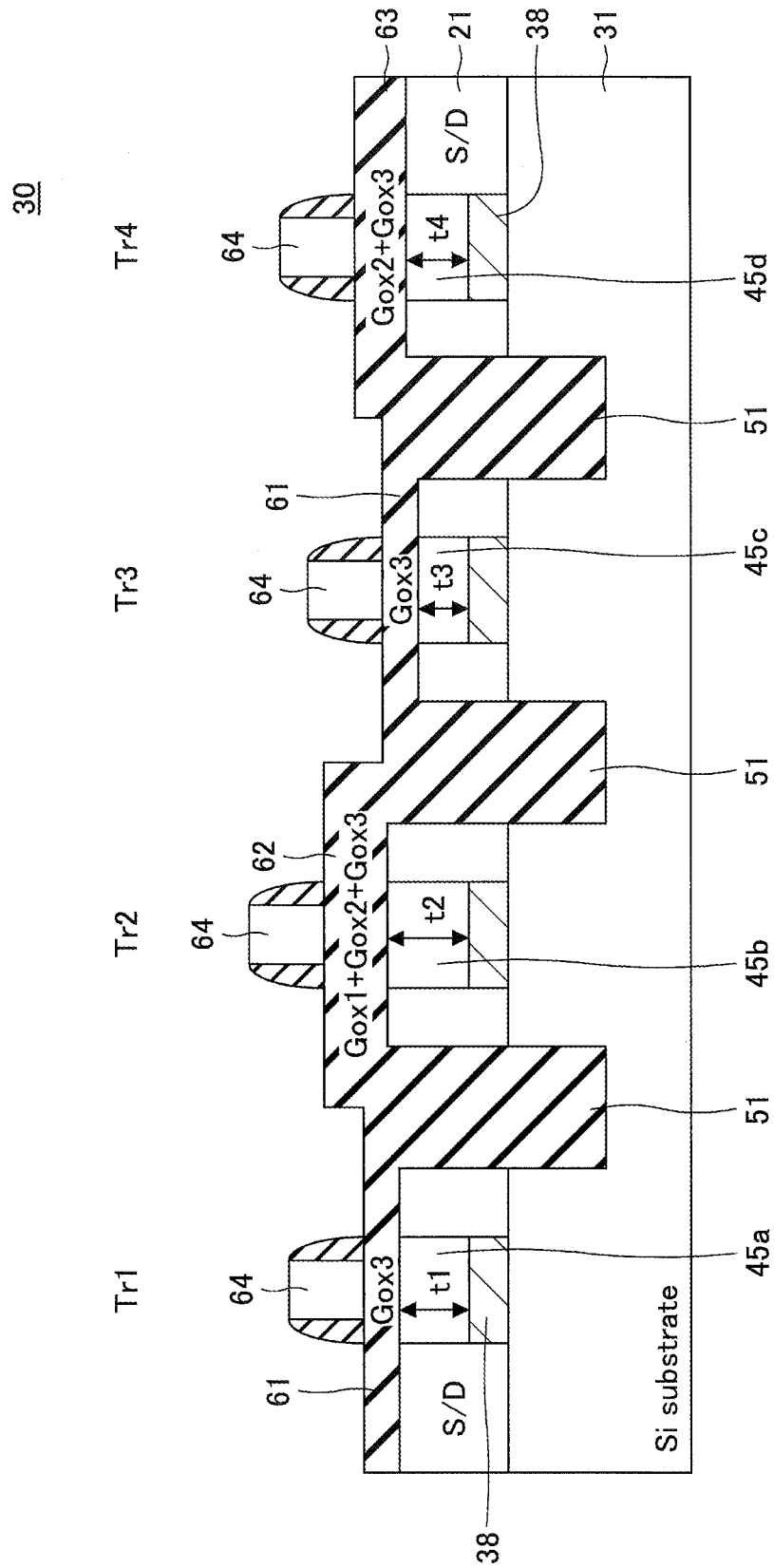
FIG. 3 is a schematic diagram of a semiconductor device fabricated using a film-thickness control technique for epitaxial silicon layers according to the first embodiment.

FIG. 3 is a schematic diagram of a semiconductor device 30 fabricated under the control of film thickness making use of a gate oxidation process according to the first embodiment. Different-type transistors Tr1, Tr2, Tr3 and Tr4 are mounted on the semiconductor device 30. For the transistors Tr1 to Tr4, the combinations of the effective film thicknesses t1, t2, t3, and t4 of epitaxial silicon layers 45a, 45b, 45c and 45d and the thicknesses of the gate oxide films 61-63 are different from each other. The transistor Tr1 is a low-threshold and low-voltage transistor, and the transistor Tr3 is a high-threshold and low-voltage transistor. The transistors Tr2 and Tr4 are high voltage and low-threshold voltage with different threshold voltages and different operating voltages. The transistor Tr1 is arranged in a circuit area that performs high-speed operations. The transistor Tr3 is arranged in a circuit area in which leakage currents are reduced. The transistors Tr2 and Tr4 are arranged in an area to which a high voltage is applied.

In the respective areas, a highly doped impurity layer 38 is formed under the epitaxial silicon layers 45a, 45b, 45c and 45d. The highly doped impurity layer 38 is provided to control the threshold voltages and prevent the punch-through effect. For convenience sake, the highly doped impurity layer 38 is referred to as "punch-through stop layer 38".

Comparing transistor Tr1 and transistor Tr3, the depth of the punch-through stop layer 38 located under the channel with the effective thickness t1 is greater than the depth of the punch-through stop player 38 located under the channel with the effective thickness t3 (t1>t3). In the transistors Tr2 and Tr4, the punch-through stop layer 38 are located at appropriate depths to control the associated threshold voltages.

In this example, the effective thicknesses of the epitaxial silicon layers 45a, 45b, 45c and 45d are varied making use of a process of forming gate oxide films of the high-voltage transistors Tr2 and Tr4. The combination of the effective thickness of the epitaxial silicon layers 45a through 45d and the thickness of the gate oxide films 61-63 differs among the transistors Tr1, Tr2, Tr3 and Tr4.

Figure 4D:
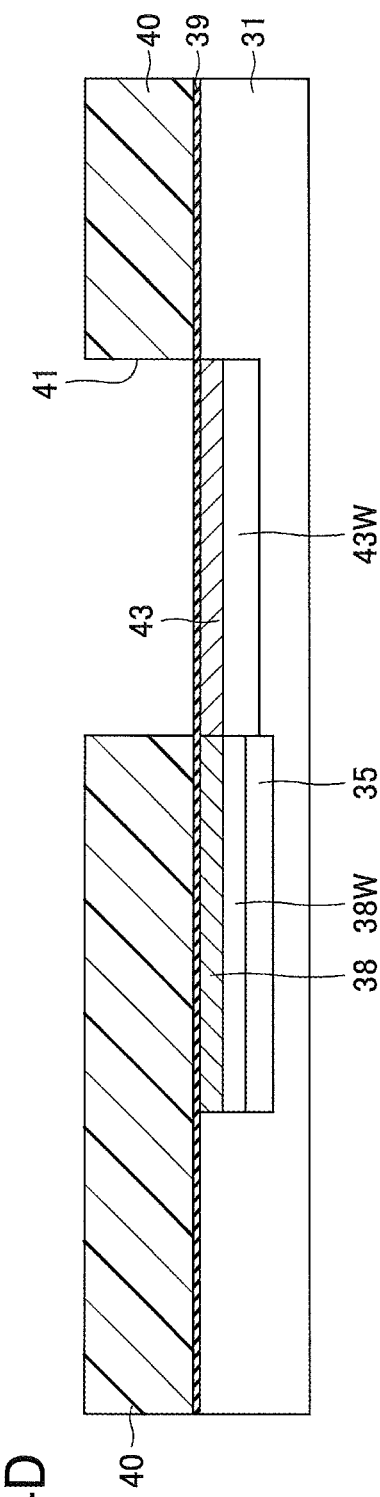
FIG. 4D illustrates a manufacturing process of the semiconductor device of the first embodiment.

FIG. 4A through FIG. 4H, FIG. 5, and FIG. 6A through FIG. 6F illustrate a manufacturing process of the semiconductor device 30 according to the first embodiment. In FIG. 4A, a silicon oxide film 32 is formed by, for example, thermal oxidation, over the entire surface of the silicon substrate 31. The silicon oxide film 32 protects the surface of the silicon substrate 31.

In FIG. 4B, a photoresist film 33 with an opening 34 is formed. An area for low-voltage NMOS (n-channel metal-oxide-silicon) transistors is exposed in the opening 34, while the other area is covered with the photoresist film 33. Ion implantation is carried out using the photoresist film 33 as a mask to form an embedded N-well 35 in the low-voltage NMOS transistor forming area. The embedded N-well 35 may be fabricated by injecting phosphor ions at an acceleration energy of 700 keV with dose of $1.5 \times 10^{13}$ cm$^{-2}$. Then, the photoresist film 33 is removed by, for example, a wet process.

In FIG. 4C, a photoresist film 36 with an opening 37 is formed by photolithography. The low-voltage NMOS transistor forming area is again exposed in the opening 37, while the other area is covered with the photoresist film 36. Ion implantation is performed using the photoresist film 36 as a mask to form a P-well 38W and a highly doped p-type impurity layer 38. The P-well 38W may be formed by injecting, for example, boron ions (B+) at an acceleration energy of 150 keV with dose of $7.5 \times 10^{12}$ cm$^{-2}$ in four oblique incident directions with respect to the normal of the silicon substrate 31. The highly doped p-type impurity layer 38 may be formed by injection of germanium ions (Ge+), carbon ions (C+), boron ions (B+), and boron fluoride (BF). For example, germanium ions are injected at an acceleration energy of 30 keV with dose of $5 \times 10^{14}$ cm$^{-2}$. Carbon ions may be injected at an acceleration energy of 5 keV with dose of $5 \times 10^{14}$ cm$^{-2}$. Boron ions may be injected at an acceleration energy of 20 keV with dose of $1.8 \times 10^{13}$ cm$^{-2}$. Boron fluoride ions (BF$_2$+) may be injected at an acceleration energy of 10 to 25 keV with dose of $2 \times 10^{12}$ cm$^{-2}$ to $6 \times 10^{12}$ cm$^{-2}$.

Germanium turns the silicon substrate 31 amorphous and prevents channeling of boron ions, while increasing the probability of carbon atoms positioned at lattice points. The carbon atoms placed at the lattice points prevent diffusion of boron ions. From this viewpoint, germanium ions may be injected before carbons ions and boron ions are injected. The P-well 38W and the highly doped p-type impurity layer 38 may be formed simultaneously, or alternatively, the P-well 38W may be formed before the formation of the highly doped p-type impurity layer 38.

Then, the photoresist film 36 is removed by ashing. Thermal treatment is performed in the inactive atmosphere for damage recovery of the silicon substrate 31 due to ion implantation. The thermal treatment may be performed at 600° C., 150 seconds in the nitrogen atmosphere.

In FIG. 4D, a natural oxide film is removed by hydrofluoric acid. Then, wet oxidation is performed on the surface of the silicon substrate 31 using, for example, in-situ stream generation (ISSG) under low pressure, at 810° C., 20 seconds to form a silicon oxide film 39 with a thickness of 3 nm. Then, a photoresist film 40 with an aperture 41 is formed. An area for low-voltage PMOS transistors is exposed in the aperture 41, while the other area is covered with the photoresist film 40. Ion implantation is performed using the photoresist film 40 as a mask to form an N-well 43W and a highly doped n-type impurity layer 43 in the low-voltage PMOS transistor area. The N-well 43W may be formed by, for example, phosphorous ion implantation (P+) at an acceleration energy of 360 keV with dose of $7.5 \times 10^{12}$ cm$^{-2}$ in four oblique incident directions with respect to the normal of the silicon substrate 31. The highly doped n-type impurity layer 43 may be formed by injecting antimony ions (Sb+) at an acceleration energy of 80 keV with dose of $3 \times 10^{12}$ cm$^{-2}$ in four oblique incident directions with respect to the normal of the silicon substrate 31, then injecting antimony ions (Sb+) at an acceleration energy of 130 keV with dose of $1.5 \times 10^{12}$ cm$^{-2}$ in four oblique incident directions with respect to the normal of the silicon substrate 31, and injecting antimony ions (Sb+) at an acceleration energy of 20 keV with $7 \times 10^{12}$ cm$^{-2}$ dose in four oblique incident directions.

Figure 4E:
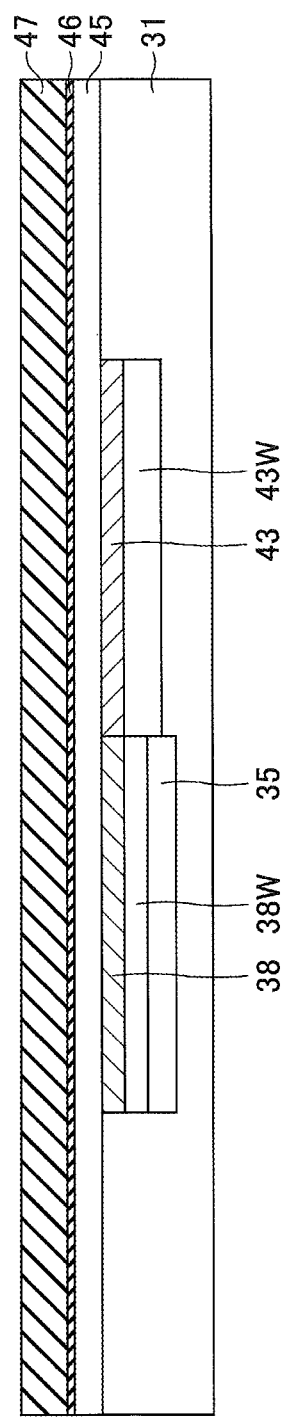
FIG. 4E illustrates a manufacturing process of the semiconductor device of the first embodiment.

In FIG. 4E, the photoresist film 40 is removed by, for example, ashing. Then, silicon oxide film 39 is removed by wet etching using a hydrofluoric acid. Then, wet oxidation is performed on the surface of the silicon substrate 31 using, for example, ISSG, to form a silicon oxide film (not illustrated). Then, the silicon oxide film is removed by wet etching using hydrofluoric acid. Then, a non-doped silicon layer 45 with a thickness of 25 nm is epitaxially grown over the silicon substrate 31 by chemical vapor deposition (CVD) or other suitable methods. This silicon layer 45 is referred to as the "epitaxial silicon layer 45".

Then, wet oxidation is performed on the surface of the epitaxial silicon layer 45 using, for example, ISSG, under low pressure, 810° C., 20 seconds to form a silicon oxide film 46 with a thickness of, for example, 3 nm. Then, a silicon nitride film 47 with a thickness of 70 nm is formed over the silicon oxide film 46 by, for example, low pressure chemical vapor deposition (LPCVD) under the conditions of 700° C., 150 minutes.

Figure 4F:
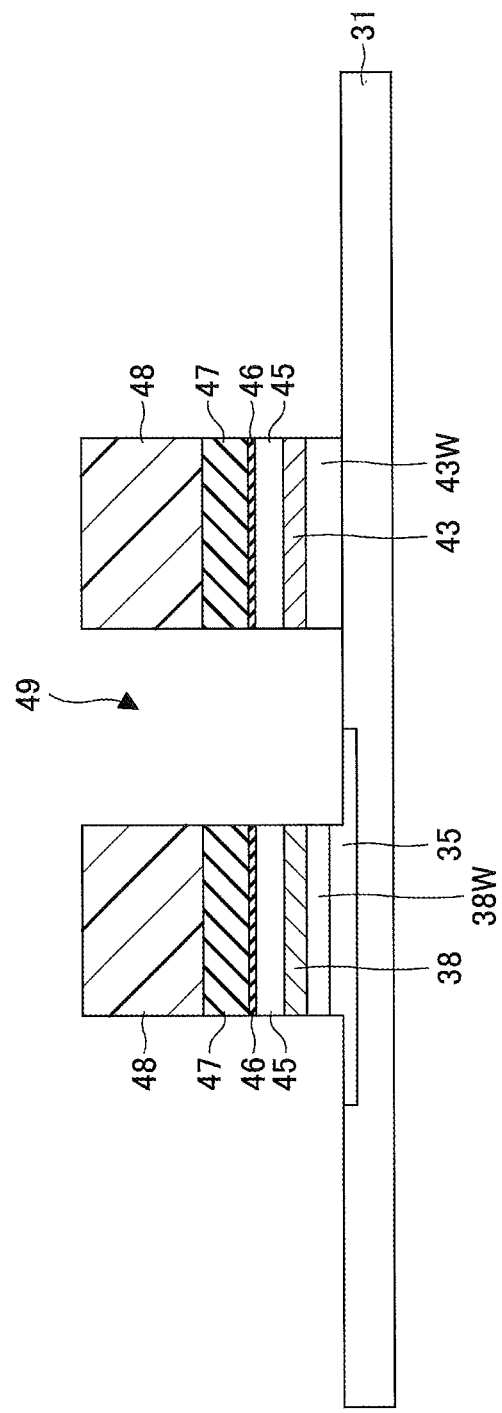
FIG. 4F illustrates a manufacturing process of the semiconductor device of the first embodiment.

In FIG. 4F, the silicon nitride film 47, the silicon oxide film 46, the epitaxial silicon layer 45, and the silicon substrate 31 are processed by anisotropic dry etching using the photoresist film 48 as a mask formed by photolithography. By this process, a device isolating trench 49 is formed in a predetermined region.

Figure 4G:
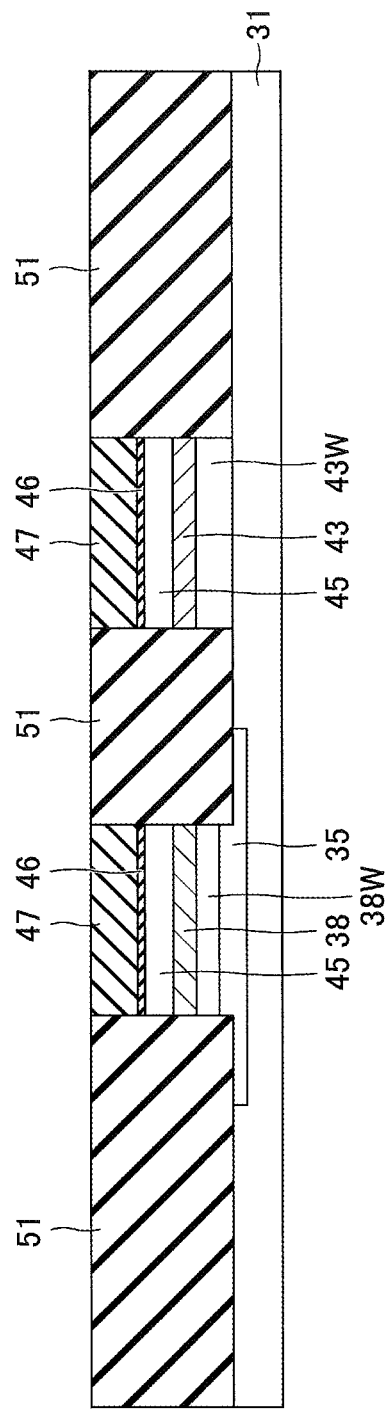
FIG. 4G illustrates a manufacturing process of the semiconductor device of the first embodiment.

In FIG. 4G, using, for example, a thermal oxidation technique, the surfaces of the epitaxial silicon layer 45 and the silicon substrate 31 are oxidized at 650° C. via a free radical. By this process, a silicon oxide film is formed as a liner film on the inner wall of the device isolating trench 49. Then, a silicon oxide film with a thickness of 500 nm is deposited by high-density plasma CVD to fill the device isolating trench 49 with the silicon oxide film. Then, chemical mechanical planarization or polishing (CMP) is performed to remove the surplus CVD oxide from the top of the silicon nitride film 47, whereby an isolation region 51 is formed.

Figure 4H:
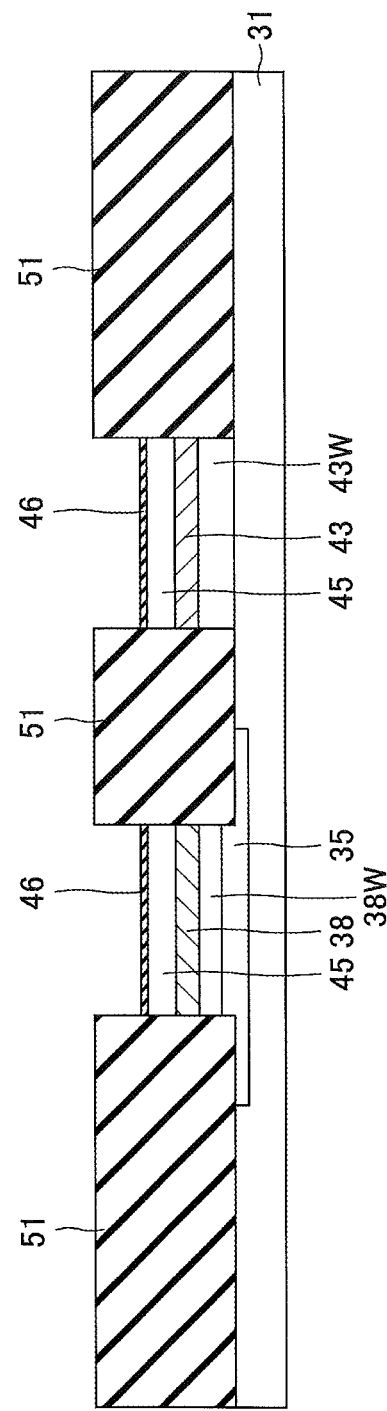
FIG. 4H illustrates a manufacturing process of the semiconductor device of the first embodiment.

In FIG. 4H, the silicon nitride film 47 is removed by wet etching using hot phosphoric acid.

Figure 5:
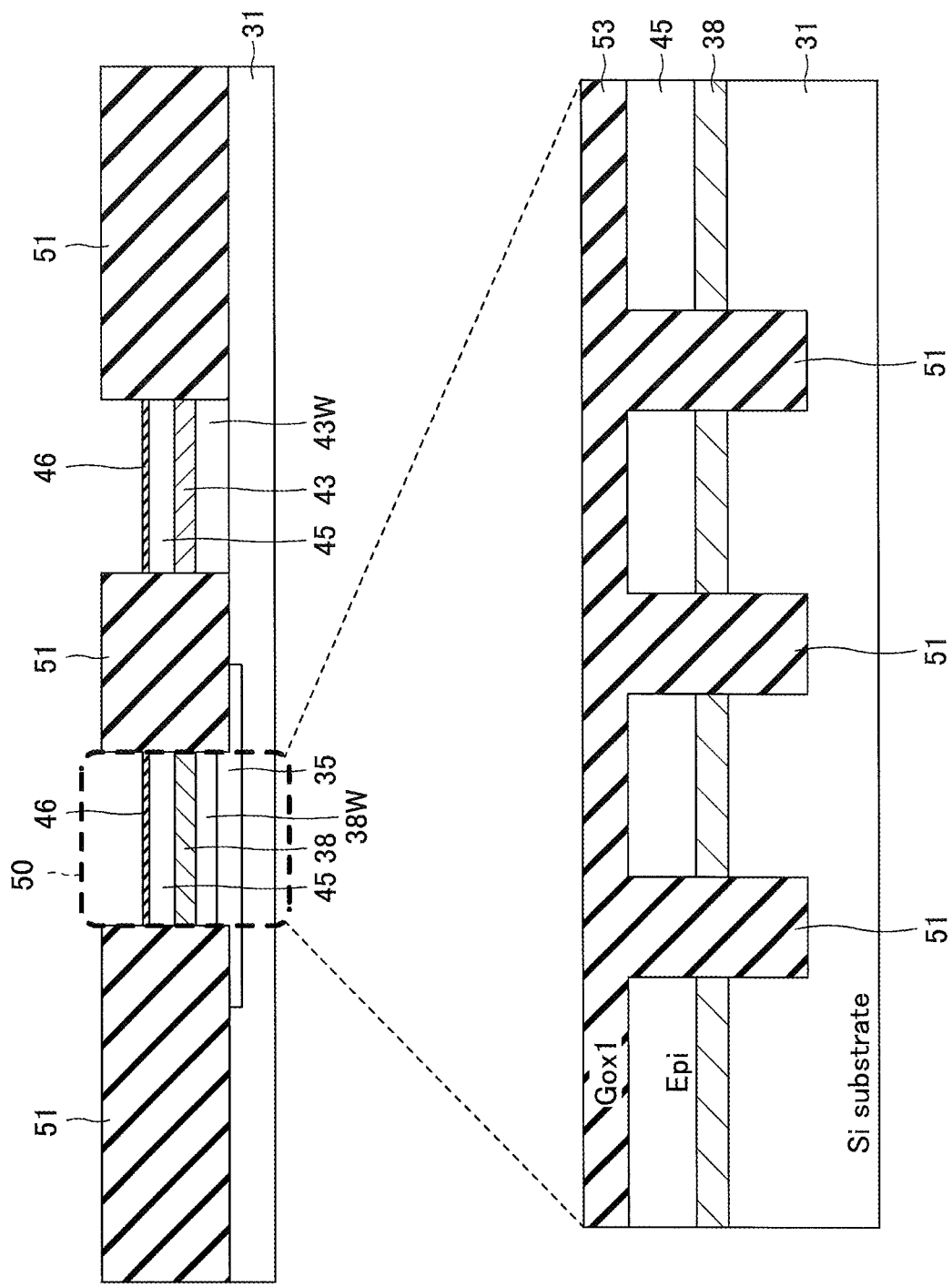
FIG. 5 illustrates a manufacturing process of the semiconductor device of the first embodiment.

The steps of FIG. 5 and subsequent are explained focusing on the area 50 in which NMOS transistors are to be formed; however, the similar steps are carried out in the PMOS transistor area. In FIG. 5, the silicon oxide film 46 is removed by wet etching using a hydrofluoric acid. Then, wet thermal oxidation is performed on the surface of the epitaxial silicon layer 45 to form a silicon oxide film (Gox1) 53 with a thickness of 6 nm. This step corresponds to gate oxidation 1 (S2) of FIG. 2. The conditions of the wet thermal oxidation are, for example, 750° C. and 30 minutes. After FIG. 5, illustration of the P-well 38W is omitted.

In FIG. 6A, a portion of the silicon oxide film 53 is removed by photolithography and hydrofluoric acid wet etching, using a photoresist film 54 as a mask. This step corresponds to oxide film etching 1 (S3) of FIG. 2.

In FIG. 6B, the photoresist film 54 is removed, and wet thermal oxidation is performed on the surface of the epitaxial silicon layer 45 to form a silicon oxide film (Gox2) 56 with a thickness of 6 nm. The wet thermal oxidation may be performed under the conditions of 750° C. and 20 minutes. This step corresponds to gate oxidation 2 (S4) of FIG. 2.

During this process, the surface area of the epitaxial silicon layer 54 that has not been covered with the photoresist film 54 is oxidized to a certain depth and becomes a part of the silicon oxide film 56. The epitaxial silicon layer 45 of this area becomes an epitaxial silicon layer 45$_f$ with a reduced thickness. On the other hand, in the area that has been covered with the photoresist film 54, the second silicon oxide film (Gox2) is formed over the silicon oxide film (Gox1) 53. As a result, a silicon oxide film (Gox1+Gox2) 57 is produced. The thickness of the silicon oxide film 57 is about 8.5 nm to 9 nm, which thickness is less than the total thickness of the silicon oxide film 53 and the silicon oxide film 56.

Figure 6C:
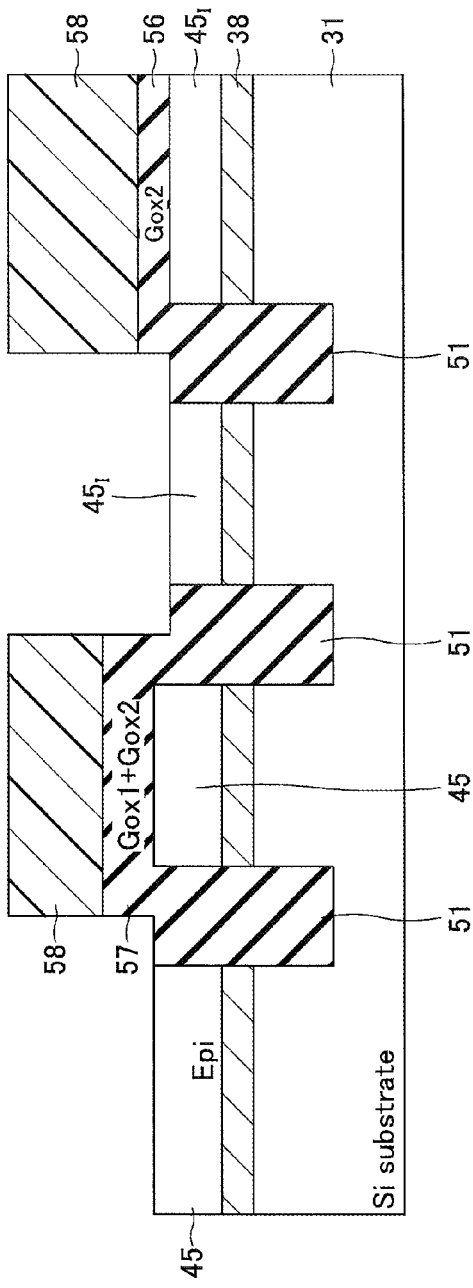
FIG. 6C illustrates a manufacturing process of the semiconductor device of the first embodiment.

In FIG. 6C, a part of the silicon oxide film 56 and a part of the silicon oxide film 57 are removed by photolithography and hydrofluoric acid wet etching, using a photoresist film 58 as a mask. This step corresponds to oxide film etching 2 (S5) in FIG. 2.

Figure 6D:
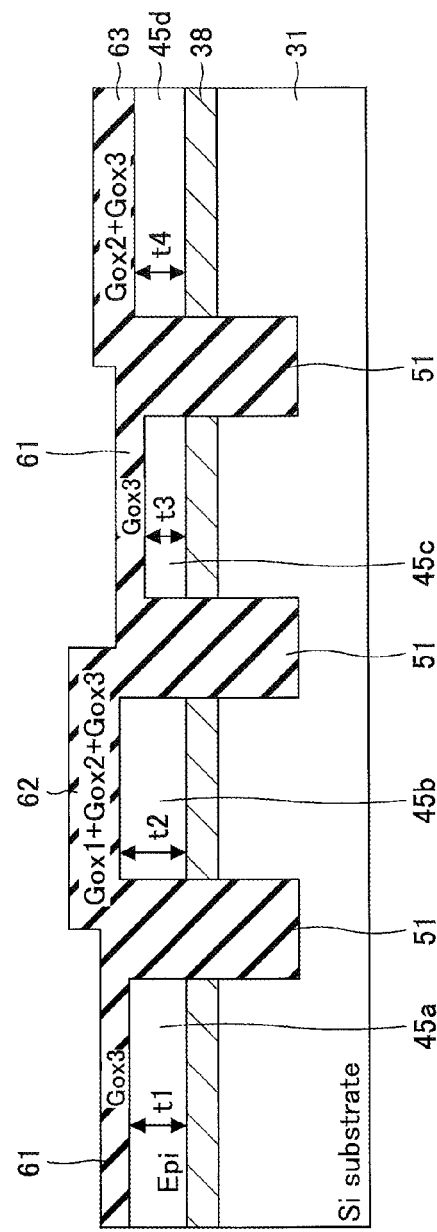
FIG. 6D illustrates a manufacturing process of the semiconductor device of the first embodiment.

In FIG. 6D, a silicon oxide film (Gox3) 61 with a thickness of 2 nm is formed over the entire surface by, for example, thermal oxidation under the conditions of 810° C. and 8 seconds. At this point of time, silicon oxide films with different thicknesses, namely, the silicon oxide film (Gox3) 61, the silicon oxide film (Gox1+Gox2+Gox3) 62, and the silicon oxide film (Gox2+Gox3) 63 are formed in the associated areas. During this thermal oxidation, the surface area of the epitaxial silicon layer 45 that has been exposed from the silicon oxide films 56 and 57 is oxidized to a certain depth, and epitaxial silicon layers 45a, 45b, 45c and 45d with different thicknesses t1, t2, t3 and t4 are produced. The epitaxial silicon layer 45d is thinner than the epitaxial silicon layer 45b, and the epitaxial silicon layer 45c is thinner than the epitaxial silicon layer 45d (t2>t4>t3). The epitaxial silicon layer 45a is thinner than the epitaxial silicon layer 45b (t2>t1).

Figure 6E:
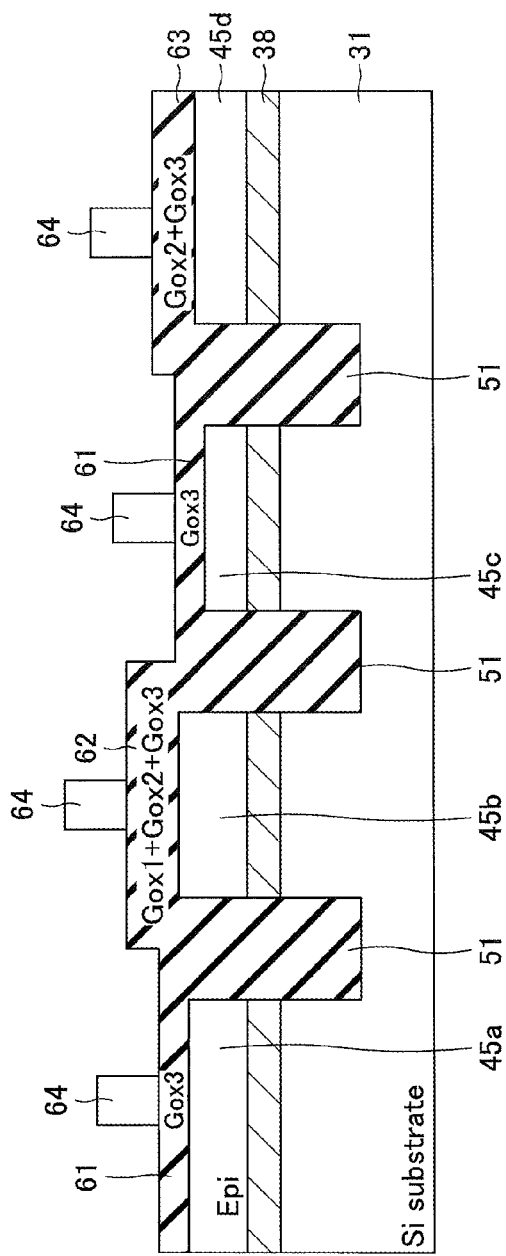
FIG. 6E illustrates a manufacturing process of the semiconductor device of the first embodiment.
Figure 6F:
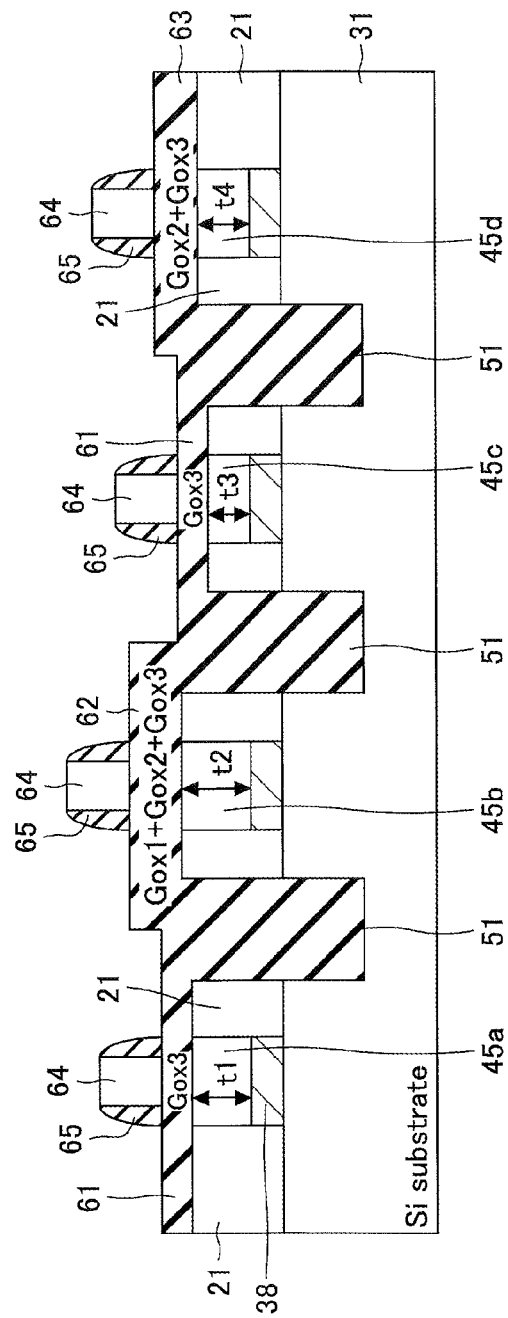
FIG. 6F illustrates a manufacturing process of the semiconductor device of the first embodiment.

In FIG. 6E, a non-doped polycrystalline silicon film with a thickness of 100 nm is formed over the entire surface by LPCVD at 605° C. The polycrystalline silicon film is patterned by photolithography and dry etching to form gate electrodes 64 in corresponding transistor fabrication areas. In FIG. 6F, sidewall spaces 65 are formed on the side walls of the gate electrodes 64, and source and drain impurity diffusion regions 21 are formed. Thus, a semiconductor device 30 with different types of transistors Tr1, Tr2, Tr3, and Tr4 is fabricated.

Second Embodiment

FIG. 7 is a schematic diagram of a semiconductor device 70 fabricated under the control of film thickness making use of a gate oxidation process according to the second embodiment. In the semiconductor device 70, different types of transistors Tr1, Tr2, Tr3 and Tr4 are mounted together with a flash memory cell transistor FL on the same chip. The effective thicknesses A, B, C and D of the epitaxial silicon layers 45a, 45b, 45c and 45d, and the thicknesses of the gate oxide films 81, 82, 83 and 84 of the transistors Tr1, Tr2, Tr3 and Tr4 are varied making use of the gate oxide film forming process of the high-voltage transistors Tr2 and Tr4. Accordingly, the transistors Tr1 through Tr4 with different threshold voltages and different operating voltages are fabricated simultaneously with the flash memory cell transistor FL.

In the respective areas, the depth of the highly doped impurity layer 38, which may be referred to as the punch-through stop layer 38, provided under the epitaxial silicon layers 45a, 45b, 45c and 45d varies. Comparing Tr1 with Tr3, the depth of the punch-through stop layer 38 located under the channel with the effective thickness A is greater than that of the punch-through stop layer 38 located under the channel with the effective thickness B (A>B). The threshold voltage of Tr3 is greater that of Tr1.

FIG. 8, FIG. 9A through FIG. 9H and FIG. 10 illustrate a manufacturing process of the semiconductor device 70 according to the second embodiment. The process up to FIG. 4H is common between the first embodiment and the second embodiment, and explanation is made focusing on the NMOS transistor area after formation of the isolating region 51.

Figure 8:
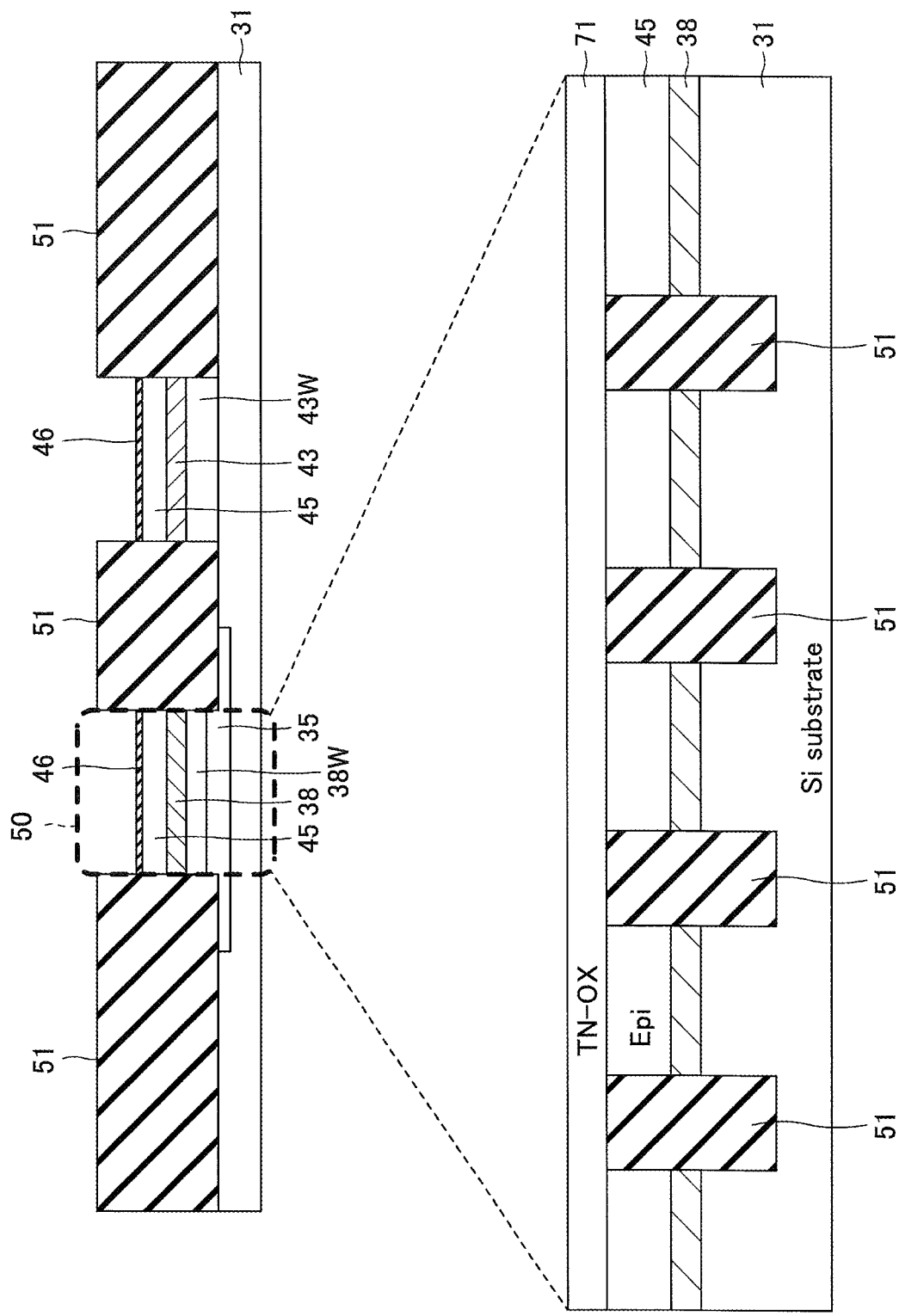
FIG. 8 illustrates a manufacturing process of the semiconductor device of the second embodiment.

In FIG. 8, the silicon oxide film 46 is removed by wet etching using a hydrofluoric acid. Then, wet thermal oxidation is performed on the surface of the epitaxial silicon layer 45 to form a tunneling oxide film (TN—OX) 71 with a thickness of 10 nm. The wet thermal oxidation may be performed under the conditions of 750° C., 65 minutes under ordinary pressure, while supplying nitrogen ($N_2$), oxygen ($O_2$) and hydrogen ($H_2$).

Figure 9A:
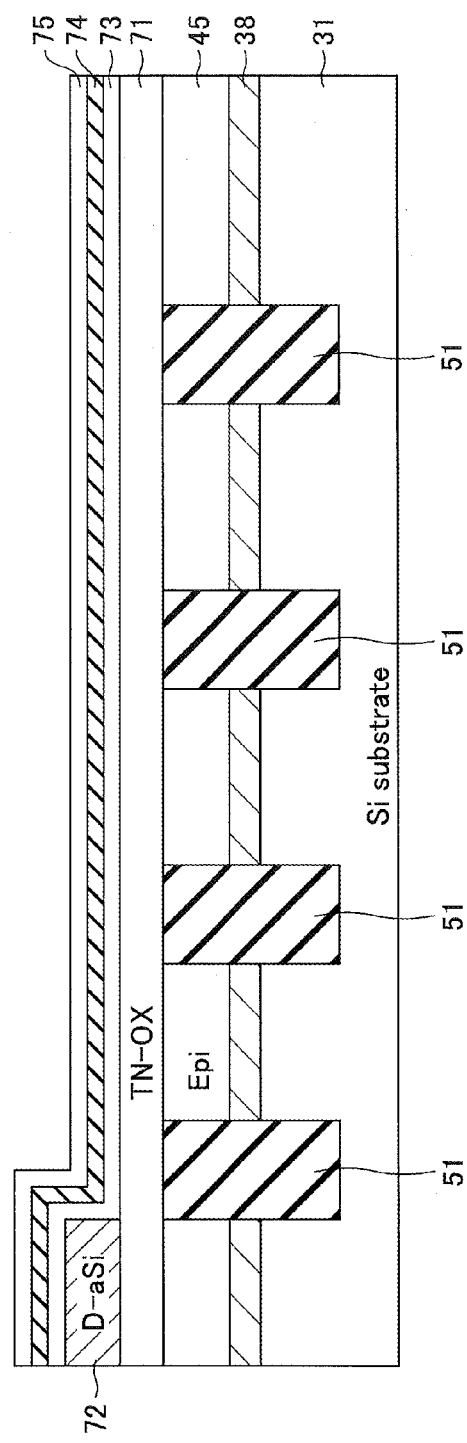
FIG. 9A illustrates a manufacturing process of the semiconductor device of the second embodiment.

In FIG. 9A, a phosphorus-doped amorphous silicon layer (D-aSi) 72 is formed over the entire surface by, for example, LPCVD, and patterned into a prescribed shape. The pattered amorphous silicon layer 72 becomes a floating gate. Then, a silicon oxide film 73 with a thickness of 5 nm is formed by LPCVD at 750° C. A silicon nitride film 74 with a thickness of 10 nm is formed over the silicon oxide film 73 at 700° C. Then silicon oxide film 75 is formed over the silicon nitride film 74 by low-pressure radical oxidation at 750° C. The layered structure of the oxide film 75, nitride film 74 and the oxide film 73 is referred to as an "ONO (oxide-nitride-oxide) film."

Figure 9B:
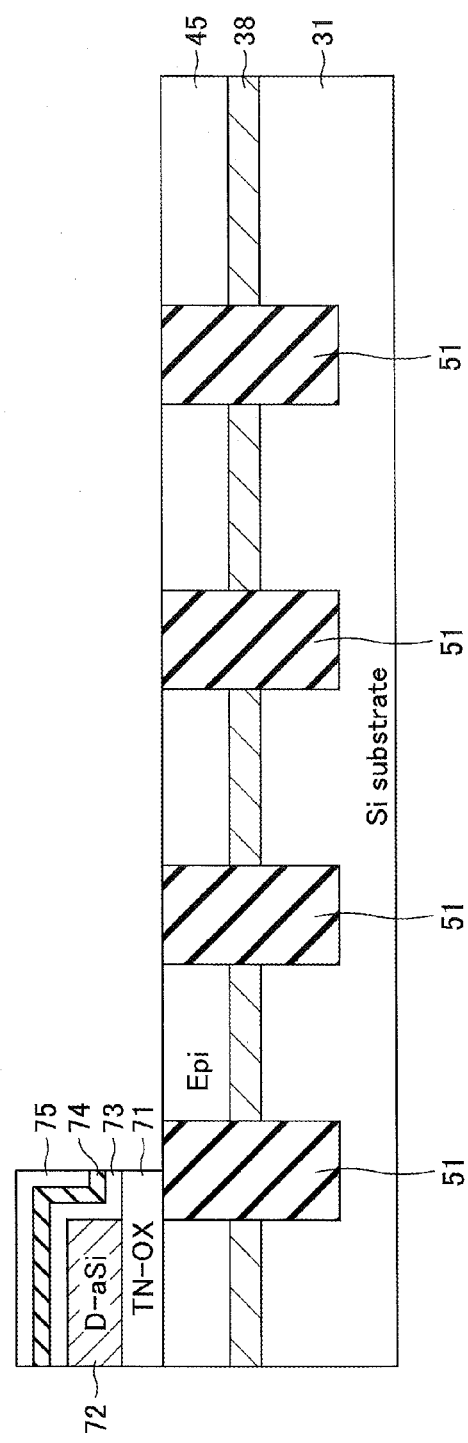
FIG. 9B illustrates a manufacturing process of the semiconductor device of the second embodiment.

In FIG. 9B, unnecessary portions of the ONO film are removed from the area other than the flash memory cell area.

In FIG. 9C, wet thermal oxidation is performed on the surface of the epitaxial silicon layer 45 at 800° C. for 30 minutes to form a silicon oxide film (Gox1) 76 with a thickness of 11 nm. During the oxidation, the thickness of the epitaxial silicon layer 45 is reduced and epitaxial silicon layer 45$_f$ remains. Because the thickness of the silicon oxide film (Gox1) 76 is greater than that of Gox1 of the first embodiment, the change in the thickness of the epitaxial silicon layer 45 to epitaxial silicon layer 45$_f$ is also different from the first embodiment.

In FIG. 9D, a portion of the silicon oxide film 76 is removed by photolithography and hydrofluoric acid wet etching using a photoresist mask 78. This step corresponds to oxide film etching 1 (S3) of FIG. 2.

Figure 9E:
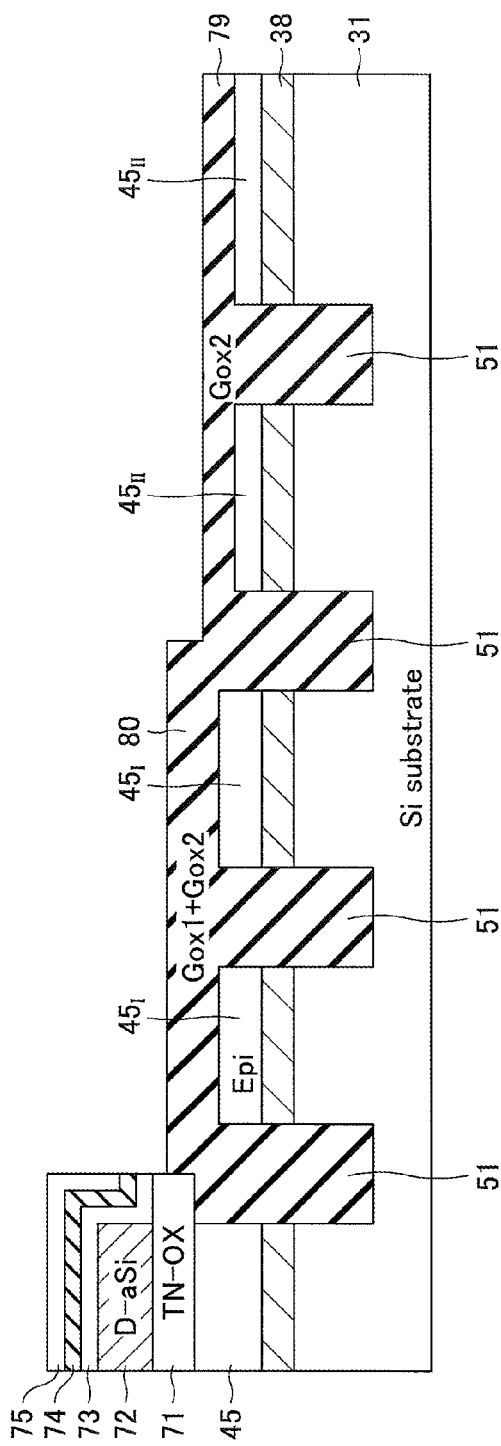
FIG. 9E illustrates a manufacturing process of the semiconductor device of the second embodiment.

In FIG. 9E, the photoresist mask 78 is removed, and wet thermal oxidation is performed on the surface of the epitaxial silicon layer 45$_f$ to form a silicon oxide film (Gox2) 79 with a thickness of 7 nm. The wet thermal oxidation may be performed under the conditions of 800° C. and 20 minutes. This step corresponds to gate oxidation 2 (S4) of FIG. 2. The surface area of the epitaxial silicon layer $45_I$ is oxidized to a certain depth and becomes a part of the silicon oxide film 79. The epitaxial silicon layer $45_I$ of this area becomes an epitaxial silicon layer $45_{II}$ with a reduced thickness. On the other hand, in the area that has been covered with the photoresist mask 78, the second silicon oxide film (Gox2) is formed over the silicon oxide film (Gox1) 76. As a result, a silicon oxide film (Gox1+Gox2) 80 is produced. The increase in the thickness of the silicon oxide film 76 to the silicon oxide film 80 is equal to or less than the increase in the thickness of the silicon oxide film 53 in the first embodiment.

Figure 9F:
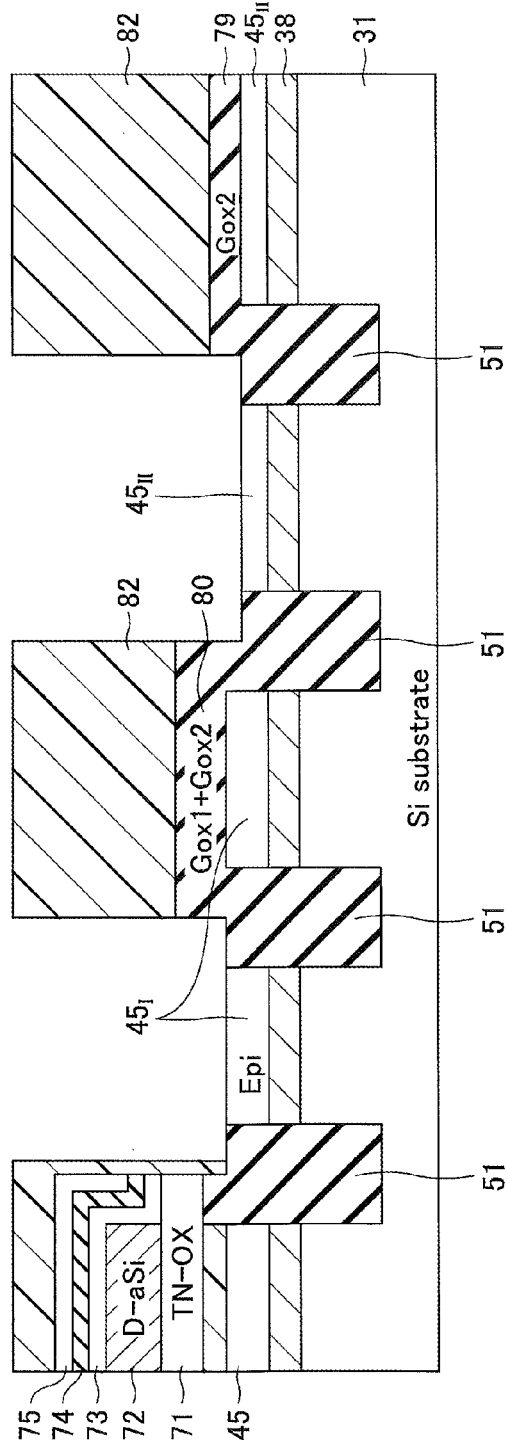
FIG. 9F illustrates a manufacturing process of the semiconductor device of the second embodiment.

In FIG. 9F, a part of the silicon oxide film 79 and a part of the silicon oxide film 80 are removed by photolithography and hydrofluoric acid wet etching, using a photoresist film 82 as a mask. Then the photoresist film 82 is removed by ashing. This step corresponds to oxide film etching 2 (S5) in FIG. 2.

In FIG. 9G, a silicon oxide film (Gox3) with a thickness of 2 nm is formed over the entire surface by, for example, thermal oxidation under the conditions of 810° C. and 8 seconds. At this point of time, silicon oxide films with different thicknesses, namely, the silicon oxide film (Gox3) 81, the silicon oxide film (Gox1+Gox2+Gox3) 82, the silicon oxide film (Gox3) 83, and the silicon oxide film (Gox2+Gox3) 84 are formed in the associated areas. During this thermal oxidation, the surface areas of the epitaxial silicon layers $45_I$ and $45_{II}$ that have been exposed from the silicon oxide films 79 and 80 are oxidized to a certain depth, and epitaxial silicon layers 45a, 45b, 45c and 45d with different thicknesses are produced. The epitaxial silicon layer 45d is thinner than the epitaxial silicon layer 45b, and the epitaxial silicon layer 45c is thinner than the epitaxial silicon layer 45d. The epitaxial silicon layer 45a is thinner than the epitaxial silicon layer 45b.

Then, thermal treatment is performed in the nitric monoxide (NO) atmosphere at 870° C. for 13 seconds to introduce nitrogen into the silicon oxide films 81, 82, 83 and 84, and another thermal treatment is performed at 1050° C. for 3 seconds.

In FIG. 9H, a non-doped polycrystalline silicon film with a thickness of 100 nm is formed over the entire surface by LPCVD at 605° C. A stacked gate 87 including the polycrystalline silicon film 85 is fabricated for the flash memory cell. The stacked gate 87 is oxidized by low-pressure radical oxidation at 750° C., and silicon nitride sidewall spacers 88 are formed. Then the polycrystalline silicon film is patterned into a prescribed shape in the area other than the flash memory cell area to form gate electrodes 86 in the corresponding transistor fabrication areas.

Figure 10:
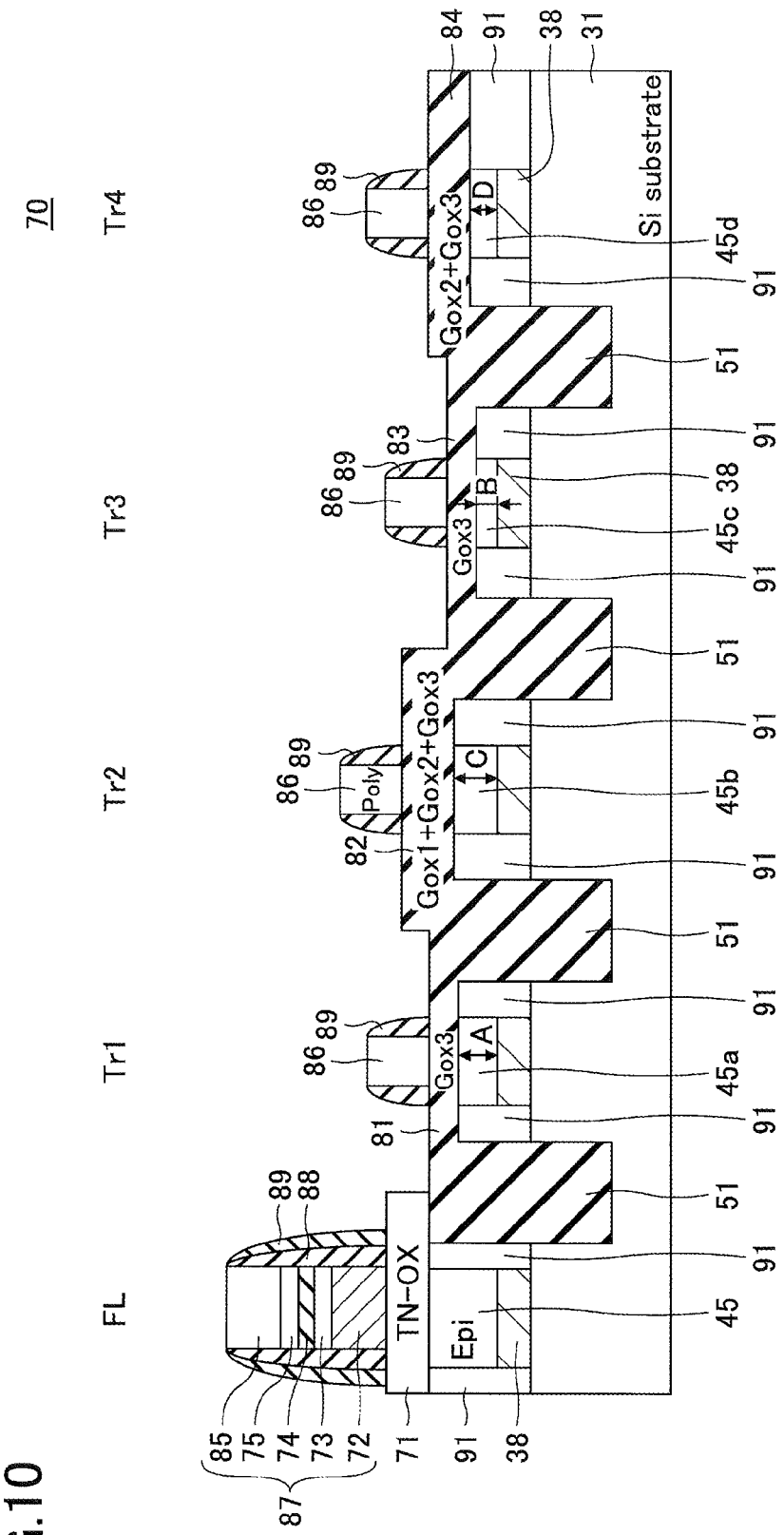
FIG. 10 illustrates a manufacturing process of the semiconductor device of the first embodiment.

In FIG. 10, a silicon oxide film with a thickness of 80 nm is formed over the entire surface by CVD at 520° C. Anisotropic etching is performed on the silicon oxide film to selectively form sidewall spacers 89 on the side walls of the gate electrodes 86 and the stacked gate 87. Then, ion implantation is performed selectively using the gate electrode 86 and 87 and the sidewall spacers 88 and 89 as a mask to form impurity regions 91, which regions becomes source and drain regions in the subsequent thermal process. The impurities are also injected in the polycrystalline silicon gates electrode 85 and 86. Then thermal treatment is performed for a short time in the inactive gas atmosphere for activation and diffusion of the impurities. The impurities diffuse into the gate electrodes 85 and 86. Thus, the semiconductor device 70 is fabricated.

In the second embodiment, the thickness of the epitaxial silicon layers 45a, 45b, 45c and 45d, and the thickness of the gate oxide films 81, 82, 83 and 84 of the transistors Tr1, Tr2, Tr3 and Tr4 are varied making use of oxidation processes. Different types of transistors with different threshold voltages and operating voltages can be mounted on the same chip.

The silicon oxide film (Gox1) formed by the process of gate oxidation 1 is thicker than that of the first embodiment. Accordingly, the difference in the film thickness can be increased between the epitaxial silicon layers 45a, 45b, 45c and 45d, as compared with the first embodiment.

Third Embodiment

Figure 11:
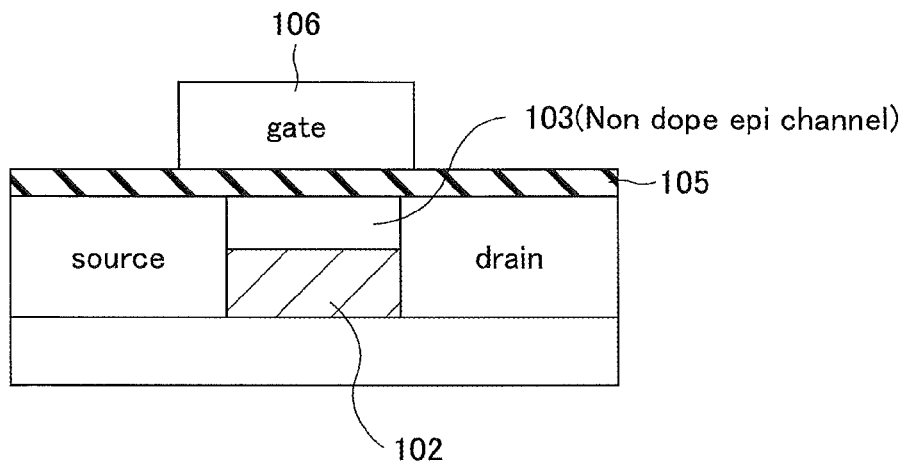
FIG. 11 is a schematic diagram of a semiconductor device to which the third embodiment is applied.

FIG. 1 through FIG. 16 illustrate control on the film thickness of an epitaxial silicon layer according to the third embodiment. FIG. 11 is a schematic diagram of a transistor to which the third embodiment is applied. A non-doped epitaxial silicon layer 103 is positioned under the gate electrode 106 formed over the impurity doped region 102. A gate oxide film 105 is provided between the gate electrode 106 and the epitaxial silicon layer 103. With this transistor structure, the thickness of the epitaxial silicon layer 103 varies depending on the wafer position in a furnace. The variations in the transistor characteristics among wafers or among lots become an issue.

Figure 12:
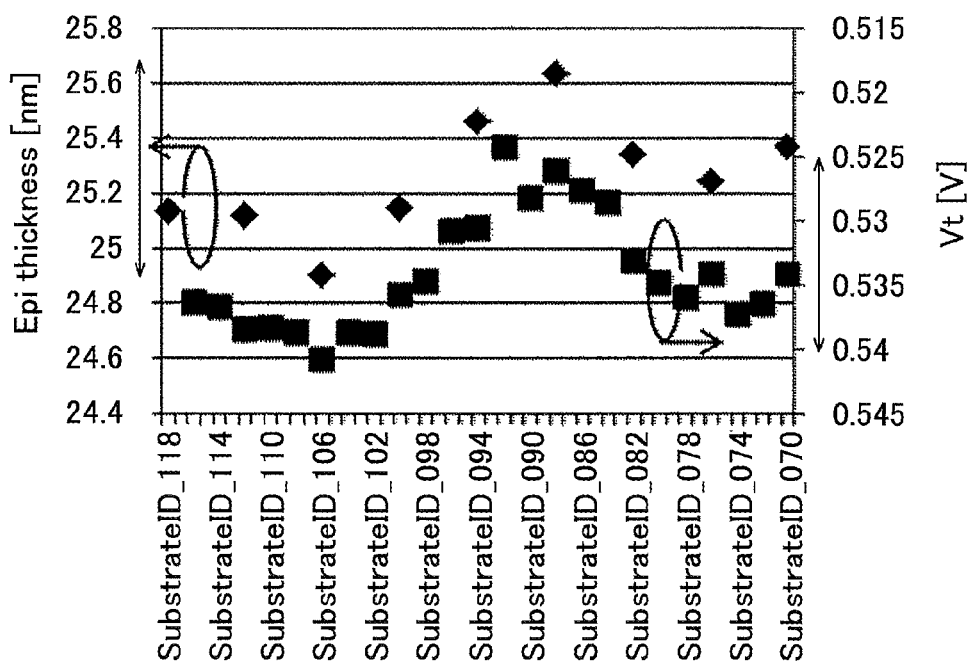
FIG. 12 illustrates variations in thickness and property of epitaxial silicon layer depending on positions in a furnace.

FIG. 12 is a diagram illustrating variations in transistor characteristic due to fluctuation in the thickness of the epitaxial silicon layer 105. The horizontal axis represents wafer position in a furnace during growth of epitaxial silicon layer 105. The vertical axis of the left-hand side represents thickness of the epitaxial silicon layer 105, and the vertical axis of the right-hand side represents threshold voltage of transistor. The thickness of the epitaxial silicon layers 105 is measured by an optical measuring system (ASET-F5x manufactured by KLA Tencor Corporation). The thickness of the epitaxial silicon layer 105 varies up to 0.7 nm among wafers depending on the wafer position in the furnace, and the threshold voltage characteristic varies up to 15 mV. In the third embodiment, the variations in the thickness of the epitaxial silicon layer 105 is reduced by controlling the thickness of the initial oxide film for each wafer.

Figure 13:
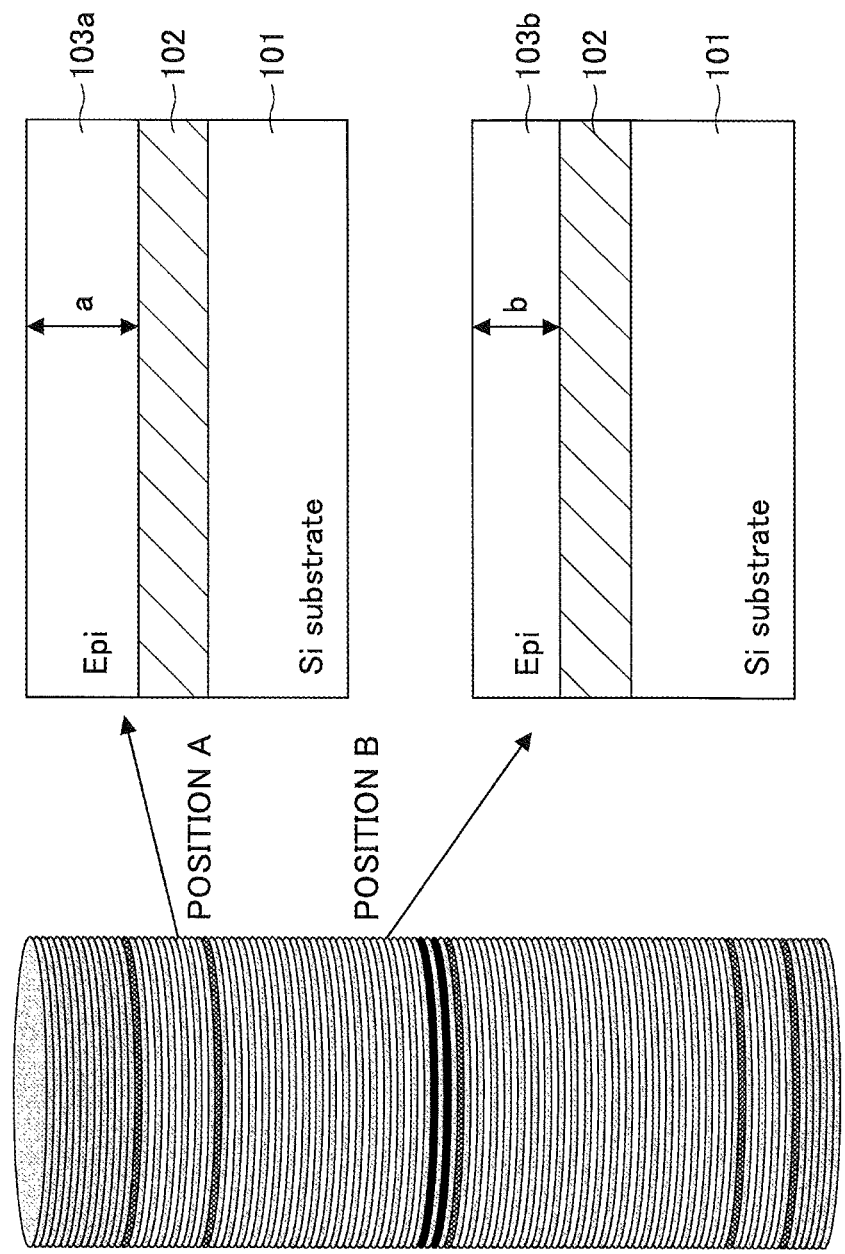
FIG. 13 is a diagram to explain setting of a thickness of an initial oxide-film for each wafer.

FIG. 13 illustrates how the thickness of the epitaxial silicon layer 103 varies among wafers. The epitaxial silicon layer 103a grown on the wafer located at position A in the furnace has a thickness "a". The epitaxial silicon layer 103b grown on the wafer located at position B in the furnace has a thickness "b" (a>b).

Figure 14:
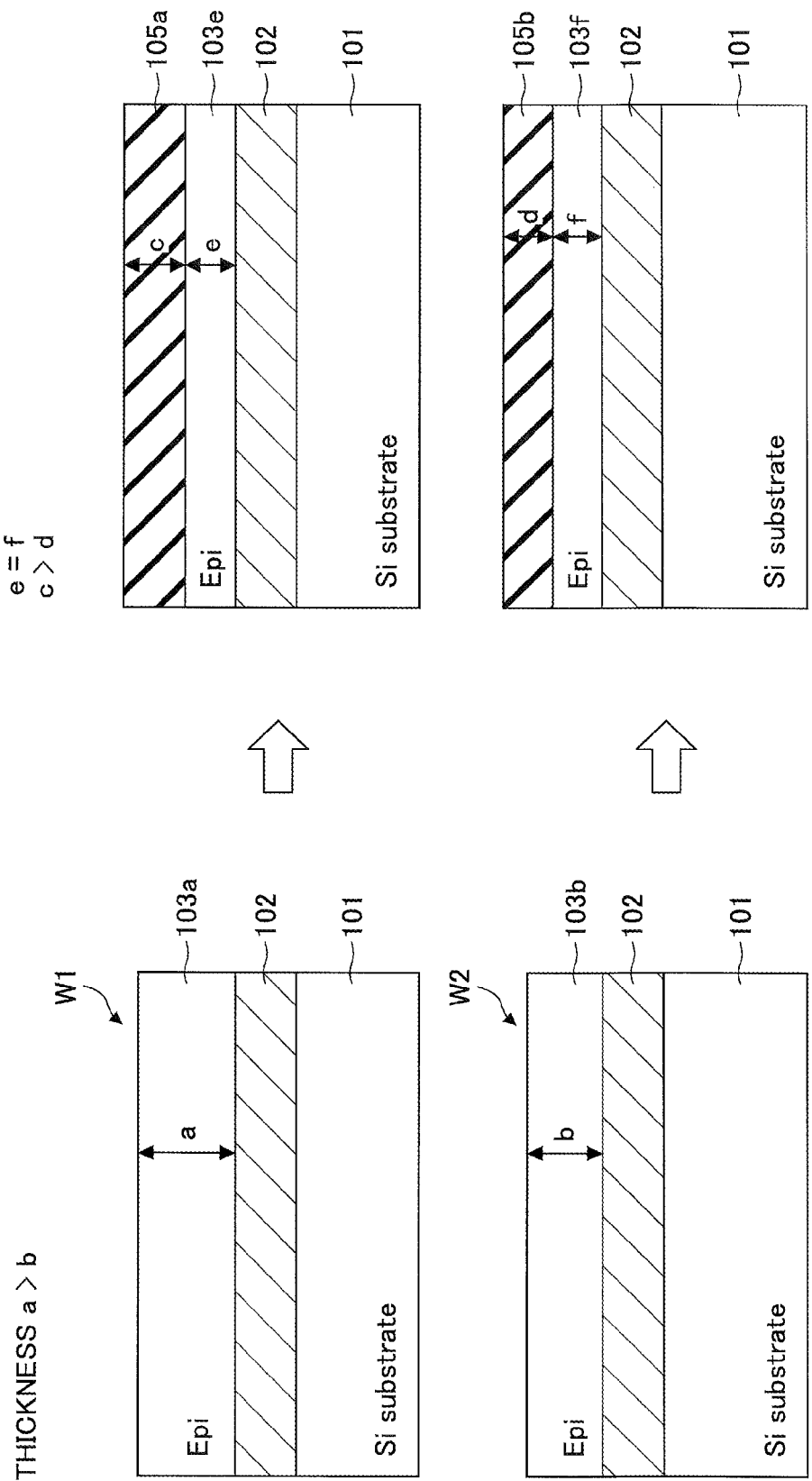
FIG. 14 is a diagram to explain setting of a thickness of an initial oxide-film for each wafer.

As illustrated in FIG. 14, by forming a silicon oxide film 105a with a thickness "c" over the epitaxial silicon layer 103a with a thickness "a" on wafer W1, the epitaxial silicon layer 103a turns to epitaxial silicon layer 103e with a reduced thickness "e". By forming a silicon oxide film 105b with a thickness "d" (c>d) is formed over the epitaxial silicon layer 103b with a thickness "b" (a>b) on wafer W2, the epitaxial silicon layer 103b turns to epitaxial silicon layer 103f with a reduced thickness "f". The thickness "c" of the silicon oxide film (i.e., the initial oxide film) 105a and the thickness "d" of the silicon oxide film (i.e., the initial oxide film) 105b are controlled such that the thickness "e" of the epitaxial silicon layer 103e becomes equal to the thickness "f" of the epitaxial silicon layer 103f.

Figure 15:
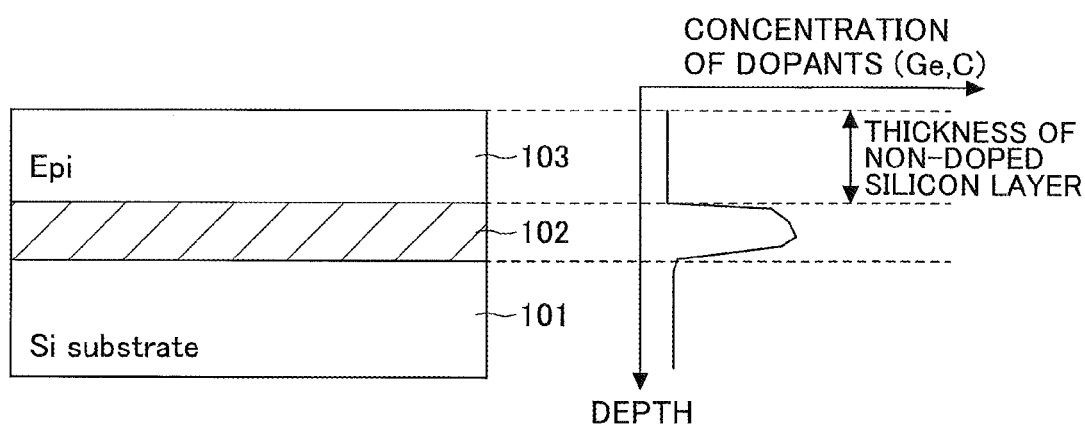
FIG. 15 illustrates a profile of impurity concentration in the depth direction of a semiconductor wafer.

FIG. 15 illustrates a concentration profile of dopants in the depth direction of a wafer on which the transistor illustrated in FIG. 11 is fabricated. Using the above-stated optical measuring system (ASET-F5x manufactured by KLA Tencor Corporation), the thickness of the highly doped impurity layer 102 and the thickness of the epitaxial silicon layer 103 are measured separately. Based upon the difference between the actually measured value and the designed value of the epitaxial silicon layer 103, the thickness of the initial oxide film 105 is determined. The thickness of the initial oxide film 105 can be adjusted by controlling the process conditions, such as processing time.

Figure 16:
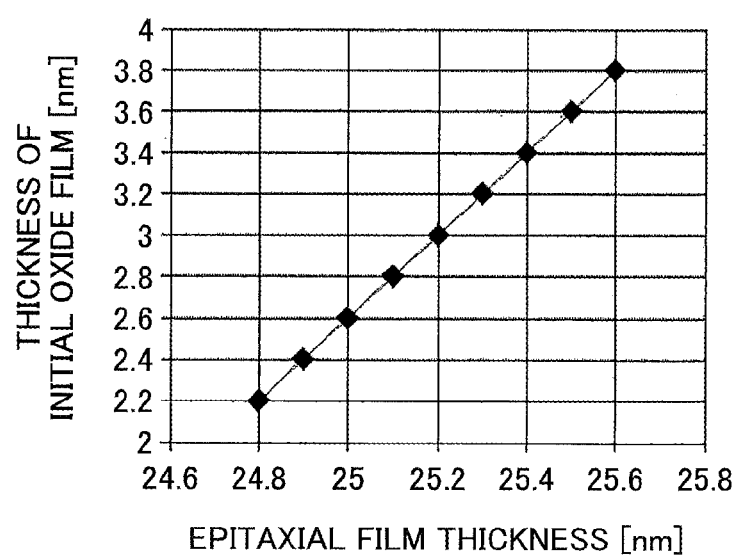
FIG. 16 illustrates a relationship between thickness of an epitaxial silicon layer and thickness of an initial oxide film.

FIG. 16 is a diagram illustrating a relationship between thickness of non-doped silicon layer epitaxially grown over the highly doped impurity layer 102 and thickness of initial oxide film 105 to be formed by oxidation. For example, a target thickness of the epitaxial silicon layer 103 is acquired under the conditions that a non-doped silicon layer with a thickness of 25.2 nm is grown and then an initial oxide film 105 with a thickness of 3.0 nm is formed by oxidation. The thickness of the initial oxide film 105 is determined, while changing the thickness of the non-doped silicon layer, such that the thickness of the post-oxidation epitaxial silicon layer 103 becomes constant.

In the example of FIG. 16, assuming that the thickness of the initial oxide film 105 is d [nm] and that the thickness of the non-doped silicon layer grown over the highly doped impurity layer 102 is t [nm], the equation $$d=2*t-47.4$$

holds. If the amount of silicon consumption during oxidation changes, then the slope of the graph changes.

Taking the silicon consuming rate during the oxidation into account, $$(d-3.0)*(\text{Si consuming rate in oxidation})=t-25.2$$

holds. Since the oxidation rate is known, the thickness d of the initial oxide film 105 is controlled by adjusting processing time.

In this way, the epitaxial silicon layer 103 with the target thickness can be formed by performing the following steps.
(a) Acquiring reference data (e.g., the data of FIG. 16) representing the relationship between the thickness of the non-doped silicon layer to be grown and the thickness of the initial oxide film under prescribed oxidation conditions.
(b) Measuring the thickness of the silicon layer of each wafer in a furnace.
(c) Determining the thickness of the initial oxide film 105 based upon the reference data.
(d) Carrying out oxidation according to the determined thickness of the initial oxide film.

Throughout the first through the third embodiments, the thickness of the epitaxial silicon layer can be controlled making use of an oxidation process, without introducing additional photolithography and etching steps. In the first embodiment, various types of transistors with different threshold voltage characteristics are mounted on the same chip by making use of a gate oxidation process during fabrication of high-voltage transistors. The degree of freedom of circuit design is increased. In the second embodiment, the thickness difference of epitaxial silicon layers between transistors can be increased, compared with the first embodiment, by increasing the thickness of the gate oxide film formed by oxidation. Consequently, transistors with a greater characteristic difference can be mounted on the same chip. In the third embodiment, variations in the transistor characteristic due to thickness fluctuation of non-doped silicon layers during epitaxial growth can be cancelled by making use of an oxidation process. Consequently, characteristic variations between wafers and between lots can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

The invention claimed is:
1. A method of manufacturing a semiconductor device, comprising:
forming a silicon layer by epitaxial growth over a semiconductor substrate having a first area and a second area;
forming a first gate oxide film by oxidizing the silicon layer;
removing the first gate oxide film from the second area, while maintaining the first gate oxide film in the first area;
after the removal of the first gate oxide film from the second area, increasing a thickness of the first gate oxide film in the first area, and simultaneously forming a second gate oxide film by oxidizing the silicon layer in the second area; and
forming a first gate electrode and a second gate electrode over the first gate oxide film and the second gate oxide film, respectively,
wherein after the formation of the first gate electrode and the second gate electrode, the silicon layer in the first area has a first thickness, and the silicon layer in the second area has a second thickness less than the first thickness.
2. The method according to claim 1,
wherein the semiconductor substrate has a third area, and
wherein the first gate oxide film is formed in the third area during the forming of the first gate oxide film,
the first gate oxide is removed from the third area during the removal of the first gate oxide from the second area by oxidizing the silicon layer, and
the second gate oxide film is formed in the third area during the forming of the second gate oxide film,
the method further comprising:
removing the second gate oxide film from the third area, while maintaining the second gate oxide film in the second area;
after the removal of the second gate oxide film from the third area, forming a third gate oxide film by oxidizing the silicon layer in the third area, while increasing the thickness of the first gate oxide film in the first area; and
forming a third gate electrode over the third gate oxide film,
wherein after the formation of the first gate electrode, the second gate electrode and the third gate electrode, the silicon layer in the third area has a third thickness less than the second thickness.
3. The method according to claim 2, wherein the semiconductor substrate has a fourth area, and
wherein the first gate oxide film is formed in the fourth area during the forming of the first gate oxide film, the first gate oxide is removed from the fourth area, while maintaining the first gate oxide film in the first area during the removal of the second gate oxide film, and the third gate oxide film is formed in the fourth area during the forming of third gate oxide film, the method further comprising:

forming a fourth gate electrode over the third gate oxide film in the fourth area, wherein after the formation of the first gate electrode, the second gate electrode, the third gate electrode and the fourth gate electrode, the silicon layer in the fourth area has a fourth thickness less than the first thickness.

4. The method according to claim 1, wherein a first transistor with the first gate electrode is formed in the first area, and a second transistor with the second gate electrode is formed in the second area, a threshold voltage of the first transistor being different from a threshold voltage of the second transistor.

5. The method according to claim 2, wherein a first transistor with the first gate electrode is formed in the first area, a second transistor with the second gate electrode is formed in the second area, and a third transistor with the third electrode is formed in the third area, and wherein a threshold voltage of the first transistor, a threshold voltage of the second transistor, and a threshold voltage of the third transistor are different from one another.

6. The method according to claim 3, wherein a first transistor with the first gate electrode is formed in the first area, a second transistor with the second gate electrode is formed in the second area, a third transistor with the third electrode is formed in the third area, and a fourth transistor with the fourth gate electrode is formed in the fourth area, and wherein a threshold voltage of the first transistor, a threshold voltage of the second transistor, a threshold voltage of the third transistor, and a threshold voltage of the fourth transistor are different from one another.

7. The method according to claim 1, wherein the semiconductor substrate has a fifth area, the method further comprising:

before the formation of the first gate oxide film, forming a tunneling oxide film over the silicon layer in the fifth area, forming a floating gate over the tunneling oxide film, forming an oxide-nitride-oxide film over the floating gate, and after the formation of the second gate oxide film, forming a fifth gate electrode over the oxide-nitride-oxide film.

8. The method according to claim 7, wherein the tunneling oxide film and the oxide-nitride-oxide film are formed in an area other than the fifth area semiconductor substrate, the method further comprising:

before the formation of the first gate oxide film, removing the tunneling oxide film and the oxide-nitride-oxide film from the area other than the fifth area, while maintaining the tunneling oxide film and the oxide-nitride-oxide film in the firth area.

9. The method according to claim 1, wherein the first gate oxide film is formed by performing wet oxidation on the silicon layer using a thermal oxidation technique.

10. The method according to claim 1, wherein the second gate oxide film is formed by performing wet oxidation on the silicon layer using a thermal oxidation technique.

11. The method according to claim 2, wherein the third gate oxide film is formed by performing wet oxidation on the silicon layer using a thermal oxidation technique.

12. The method according to claim 1, further comprising:

before the formation of the silicon layer, forming an impurity layer over the semiconductor substrate, wherein the silicon layer is epitaxially grown over the impurity layer.

* * * * *